US012701705B2

(12) United States Patent
Hao et al.

(10) Patent No.: US 12,701,705 B2
(45) Date of Patent: Aug. 4, 2026

(54) SEMICONDUCTOR STRUCTURES AND FABRICATION METHODS THEREOF, THREE-DIMENSIONAL MEMORIES, AND MEMORY SYSTEMS

(71) Applicant: Yangtze Memory Technologies Co., Ltd., Wuhan (CN)

(72) Inventors: Qi Hao, Wuhan (CN); Wei Xu, Wuhan (CN); Bin Yuan, Wuhan (CN); Zongke Xu, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 655 days.

(21) Appl. No.: 18/148,780

(22) Filed: Dec. 30, 2022

(65) Prior Publication Data

US 2024/0172439 A1      May 23, 2024

(30) Foreign Application Priority Data

Nov. 21, 2022      (CN) .......................... 202211456170.1

(51) Int. Cl.
| | |
|---|---|
| *H10B 43/27* | (2023.01) |
| *H10B 41/27* | (2023.01) |
| *H10B 41/50* | (2023.01) |
| *H10B 43/50* | (2023.01) |
| *H10B 80/00* | (2026.01) |

(52) U.S. Cl.
CPC ............. *H10B 43/27* (2023.02); *H10B 41/27* (2023.02); *H10B 41/50* (2023.02); *H10B 43/50* (2023.02); *H10B 80/00* (2023.02)

(58) Field of Classification Search
CPC ........ H10B 43/27; H10B 41/27; H10B 80/00; H10B 43/10; H10B 43/50; H10B 41/10; H10B 41/50; H10B 41/23; H10B 43/23
See application file for complete search history.

(56) References Cited

U.S. PATENT DOCUMENTS

| | | | | |
|---|---|---|---|---|
| 2018/0226341 A1* | 8/2018 | Yazawa | ............... | H10W 20/083 |
| 2021/0143100 A1* | 5/2021 | Chakravarthi | ........ | H10W 20/20 |

* cited by examiner

*Primary Examiner* — Julio J Maldonado
*Assistant Examiner* — Paul A Berry
(74) *Attorney, Agent, or Firm* — Hanley, Flight & Zimmerman, LLC

(57) ABSTRACT

In some examples, the semiconductor structures include a stack structure, a plurality of conductive structures and a first insulating layer. The stack structure may include a plurality of first dielectric layers and gate layers which are alternately disposed; the stack structure may have a memory region and a connection region, the stack structure in the connection region may include a plurality of first dielectric layers and second dielectric layers. The plurality of conductive structures may be disposed in the connection region. The conductive structure includes conductive portions insulated from each other, each conductive portion penetrates through part of the stack structure and is connected with the gate layers. Parts of the conductive portions that penetrate through the stack structure may be disposed in a nested manner. The semiconductor structure is applied to a three-dimensional memory, so as to implement reading and writing operations of data. Other examples are disclosed.

20 Claims, 21 Drawing Sheets

400

100

S100

Forming a stack structure

S200

Forming a contact hole

S300

Forming a conducive structure
within the contact hole

S210

Forming a first hole segment of a
first sub-hole

S220

Etching bottom of the first hole
segment of the first sub-hole to
form a first hole segment of a
second sub-hole

SEMICONDUCTOR STRUCTURES AND FABRICATION METHODS THEREOF, THREE-DIMENSIONAL MEMORIES, AND MEMORY SYSTEMS

CROSS-REFERENCE TO RELATED APPLICATIONS

This application claims priority to and the benefit of Chinese Patent Application No. 202211456170.1, filed on Nov. 21, 2022, which is hereby incorporated by reference in its entirety.

TECHNICAL FIELD

The present disclosure relates to semiconductor chips, and in particular, to semiconductor structures and fabrication methods thereof, three-dimensional memories, and memory systems.

BACKGROUND

As the feature size of a memory cell approaches a process lower limit, the planar process and fabrication technology become challenging and costly, resulting in that the memory density of a two dimensional (2D) or planar NAND flash memory that approaches an upper limit.

To overcome limitations brought by the 2D or planar NAND flash memory, a three-dimensional memory (3D NAND) having a three-dimensional structure has been developed in the industry, the memory density is improved by three-dimensionally disposing memory cells on a substrate.

BRIEF DESCRIPTION OF THE DRAWINGS

To illustrate technical solutions in the present disclosure more clearly, a brief introduction on the drawings, which are needed in some examples of the present disclosure, will be given below. Apparently, the drawings in the description below are merely drawings of some examples of the present disclosure, other drawings may be obtained by those ordinary skilled in the art based on the drawings. In addition, the drawings in the following description may be regarded as schematic diagrams, and are not intended to limit the actual sizes of products, the actual processes of methods, the actual timing of signals and the like involved in the examples of the present disclosure.

DETAILED DESCRIPTION

Figure 1:
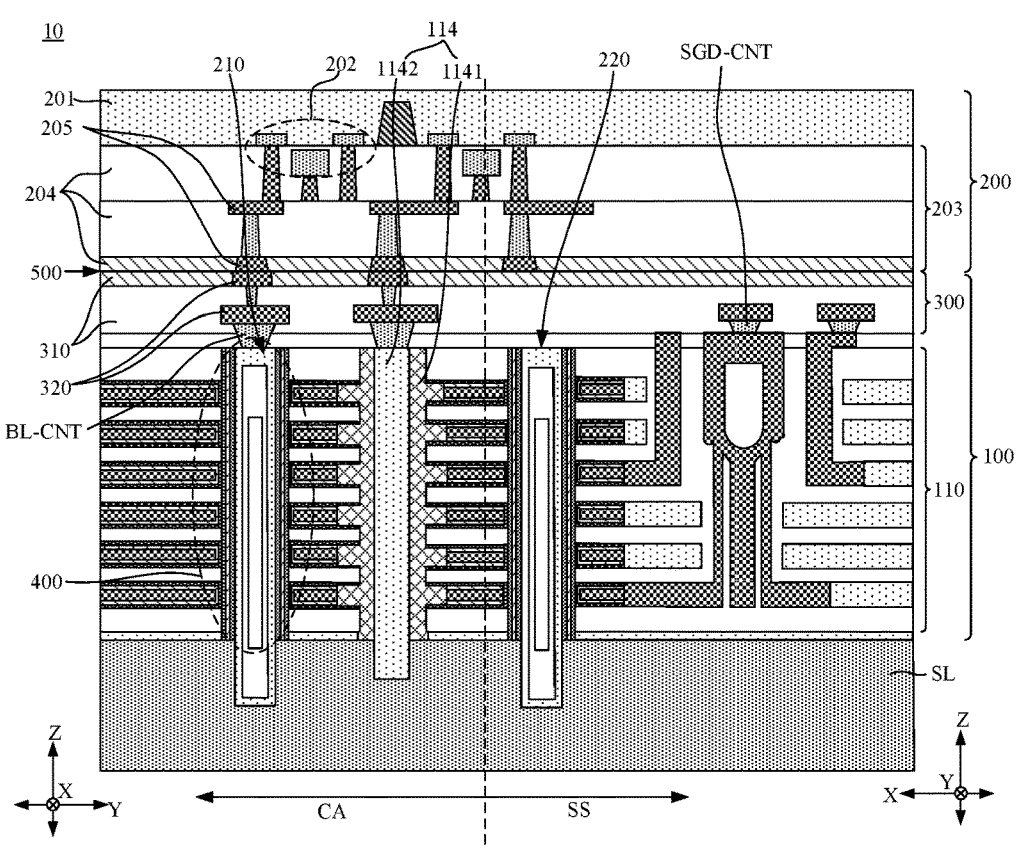
FIG. 1 is a sectional view of a three-dimensional memory according to some examples.

A clear and complete description of technical solutions in some examples of the present disclosure will be given below, in combination with the drawings. Apparently, the described examples are merely a part, but not all, of the examples of the present disclosure. All of other examples obtained by those ordinary skilled in the art based on the examples provided in the present disclosure fall into the scope of the present disclosure.

In the description of the present disclosure, it should be understood that orientation or position relationships indicated by terms "center", "upper", "lower", "front", "back", "left", "right", "vertical", "horizontal", "top", "bottom", "inside", "outside" and the like are orientation or position relationships shown on the basis of the drawings, and are merely for the convenience of describing the present disclosure and simplifying the description, but do not indicate or imply that the referred apparatuses or elements must have specific orientations or must be constructed and operated in specific orientations, and thus cannot be construed as limitations to the present disclosure.

Unless the context requires otherwise, throughout the specification and claims, the term "include" is interpreted as an open and inclusive meaning, that is, "including, but not limited to." In the description of the specification, the terms "one example" or "some examples" and the like are intended to indicate that particular features, structures, materials or characteristics related to the examples are included in at least one example of the present disclosure. The schematic representation of the above terms does not necessarily refer to the same example. Furthermore, the particular features, structures, materials or characteristics may be included in any one or more examples in any suitable manner.

Hereinafter, the terms "first" and "second" are used for descriptive purposes only and cannot be understood as indicating or implying relative importance or implicitly indicating the number of the indicated technical features. Thus, the features defined with "first" and "second" may explicitly or implicitly include one or more of the features. In the description of the examples of the present disclosure, unless otherwise specified, the meaning of "a plurality of" is two or more.

When some examples are described, "coupled" and "connected" and their derived expressions may be used. For example, the term "connected" may be used to indicate that two or more components have a direct physical contact or electrical contact with each other when describing some examples. As another example, the term "coupled" may be used to indicate that two or more components have a direct physical contact or electrical contact with each other when describing some examples. However, the term "coupled" may also indicate that two or more components do not have direct contact with each other, but still cooperate or interact with each other. The examples disclosed herein are not necessarily limited to the disclosure herein.

"A and/or B" includes the following three combinations: merely A, merely B, and a combination of A and B.

The use of "applicable to" or "configured to" herein means an open and inclusive language, which does not exclude devices which are applicable to or configured to execute additional tasks or steps.

In addition, the use of "based on" means open and inclusive, this is because processes, steps, calculations, or other actions "based on" one or more of the conditions or values may be based on additional conditions or exceed the values in practice.

As used herein, "about", "substantially" or "approximately" includes the set forth value and an average value within an acceptable deviation range of a particular value, wherein the acceptable deviation range is determined by those ordinary skilled in the art by taking into account measurements being discussed and errors related to a particular amount of measurements (i.e., limitations of a measurement system).

In the content of the present disclosure, the meanings of "on", "above" and "over" should be interpreted in a broadest manner, so that "on" not only means "directly on a thing, but also includes the meaning of "on a thing" with an intermediate feature or layer therebetween, and "above" or "over" not only means "above" or "over" a thing, but also includes the meaning of "above" or "over" a thing without an intermediate feature or layer therebetween (i.e., directly on a certain object).

Example implementations are described herein with reference to sectional views and/or plane views as idealized example drawings. In the drawings, the thicknesses of layers and regions are exaggerated for clarity. Accordingly, variations relative to the shapes of the drawings resulting from, for example, manufacturing techniques and/or tolerances, can be contemplated. Accordingly, the example implementations should not be construed as limited to the shapes of the regions shown herein, but include shape deviations resulting from, for example, manufacturing. For example, an etched region illustrated as a rectangle typically has a curved feature. Thus, the regions illustrated in the figures are schematic in nature, and their shapes are not intended to illustrate the actual shapes of the regions of the device, and are not intended to limit the scope of the example implementations.

As used herein, the term "substrate" refers to a material on which subsequent material layers may be added. The substrate itself may be patterned. The material added on the substrate may be patterned or may remain unpatterned. Further, the substrate may include a variety of semiconductor materials such as silicon, germanium, gallium arsenide, indium phosphide, and the like. Alternatively, the substrate may be made of a non-conductive material such as glass, plastic, or sapphire wafer.

Figure 2:
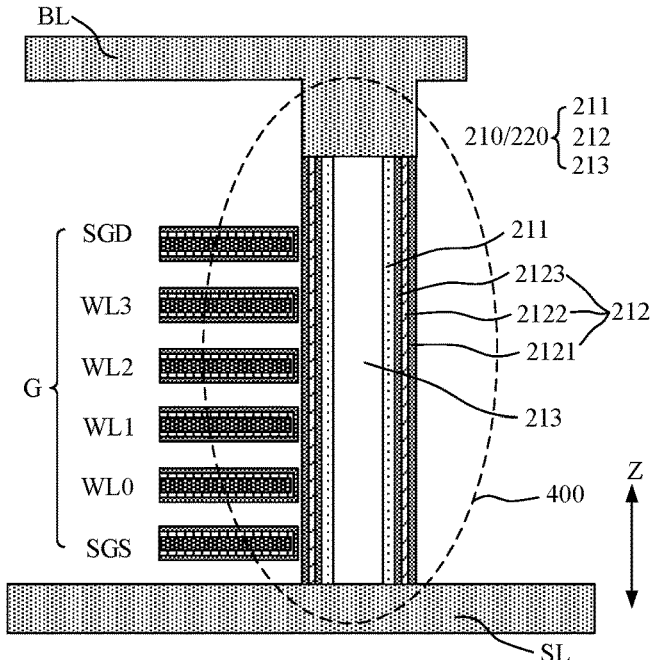
FIG. 2 is a sectional view of one memory cell string in a three-dimensional memory according to some examples.
Figure 3:
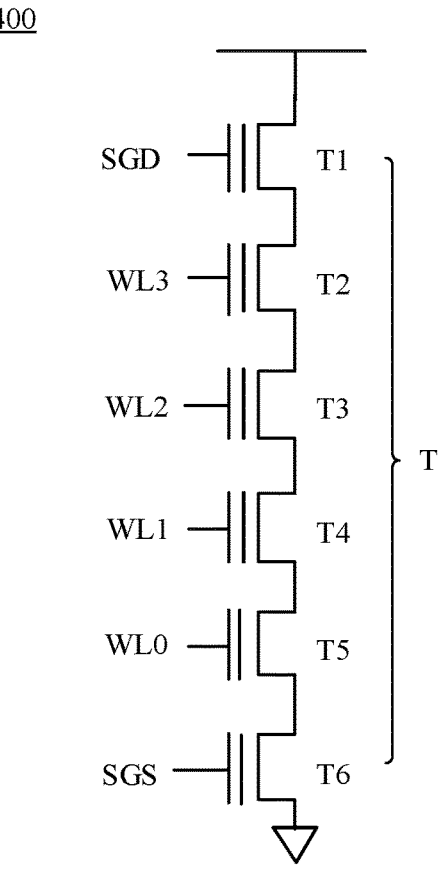
FIG. 3 is an equivalent circuit diagram of the memory cell string in FIG. 2.

FIG. 1 is a sectional view of a three-dimensional memory provided by some examples of the present disclosure, FIG. 2 is a sectional view of one memory cell string in the three-dimensional memory in FIG. 1, FIG. 3 is an equivalent circuit diagram of the memory cell string in FIG. 2.

In FIG. 1 and FIG. 2, a three-dimensional memory 10 extends in an X-Y plane, a first direction X and a second direction Y are, for example, two orthogonal directions in a plane where a semiconductor structure 100 is located (e.g., a plane where a source layer SL is located): the first direction X is, for example, an extension direction of a word line WL, the second direction Y is, for example, an extension direction of a bit line BL. A third direction Z is perpendicular to the plane where the semiconductor structure 100 is located, that is, perpendicular to the X-Y plane.

As used in the present disclosure, one component being "on", "above" or "below" another component (e.g., a layer, a structure or a device) of the three-dimensional memory is determined in the third direction Z relative to a substrate 170 (see FIG. 6) or the source layer SL of the semiconductor structure 100 when the substrate or the source layer SL is located in the lowest plane of the semiconductor structure 100 in the third direction Z. Throughout the present disclosure, the same concept is used to describe spatial relationships.

In order to show the structure of the device more clearly, a view of a memory region CA and a view of a connection region SS are shown in FIG. 1, the view of the memory region CA is based on coordinate system at the left side, the view of the connection region SS is based on coordinate system at the right side, that is, the view of the memory region CA shows a cross-sectional structure of the memory region CA of the three-dimensional memory 10 in the Y direction, the view of the connection region SS shows a cross-sectional structure of the connection region SS of the three-dimensional memory 10 in the X direction.

Referring to FIG. 1, some examples of the present disclosure provide a three-dimensional memory 10. The three-dimensional memory 10 may include a semiconductor structure 100.

Exemplarily, referring to FIG. 1, the three-dimensional memory 10 may further include a source layer SL coupled with the semiconductor structure 100, and a peripheral device 200 coupled with the semiconductor structure 100. The peripheral device 200 may be disposed on a side of the semiconductor structure 100 far away from the source layer SL.

A material of the source layer SL may include a semiconductor material such as monocrystalline silicon, polysilicon, monocrystalline germanium, III-V compound semiconductor material, II-VI compound semiconductor material, and other suitable semiconductor materials. The source layer SL may be partially or fully doped. Exemplarily, the source layer SL may include a doped region which is doped with P-type dopant. The source layer SL may further include a non-doped region.

Here, the peripheral device 200 may be disposed on the side of the semiconductor structure 100 far away from the source layer SL.

The peripheral device 200 may include a peripheral circuit. The peripheral circuit is configured to control and sense an array device. The peripheral circuit may be any suitable digital, analog and/or mixed signal control and sensing circuit for supporting the operation (or work) of the array device, including, but is not limited to, a page buffer, a decoder (e.g., a row decoder and a column decoder), a sense amplifier, a driver (e.g., a gate line driver), a charge pump, a current or voltage reference, or any active or passive component (e.g., a transistor, a diode, a resistor or a capacitor) of a circuit. The peripheral circuit may further include any other circuits that are compatible with the advanced logic process, including a logic circuit (e.g., a processor and a programmable logic device (PLD) or a memory circuit (e.g., a three-dimensional static random-access memory (SRAM)).

In some examples, as shown in FIG. 1, the peripheral device 200 may include a substrate 201, a peripheral circuit disposed on the substrate 201, and a peripheral interconnection layer 203 disposed on the substrate 201. The peripheral circuit may include a transistor 202.

The material of the substrate 201 may be monocrystalline silicon, and may also be other suitable materials, such as silicon germanium, germanium, or a silicon-on-insulator film.

The peripheral interconnection layer 203 is coupled with the transistor 202 to transmit an electrical signal between the transistor 202 and the peripheral interconnection layer 203. The peripheral interconnection layer 203 may include one or more second interlayer insulating layers 204, and may further include one or more second interconnection conductor layers 205. Different second interconnection conductor layers 205 may be coupled by contacts.

The material of the second interconnection conductor layer 205 and the contact may be a conductive material, for example, one or more combinations of tungsten, cobalt, copper, aluminum, and metal silicide, and may also be other suitable materials.

The material of the second interlayer insulating layer 204 is an insulating material, for example, one or more combinations of silicon oxide, silicon nitride and an insulating material with a high dielectric constant, and may also be other suitable materials.

Referring to FIG. 1, the semiconductor structure 100 may include memory cell strings 400 (referred to herein as "memory cell strings", such as NAND memory cell strings) arranged in an array. The source layer SL may be coupled with source terminals of the plurality of memory cell strings 400.

Specifically, referring to FIG. 2 and FIG. 3, the memory cell string 400 may include a plurality of transistors T, one transistor T (e.g., T1-T6 in FIG. 3) may be configured as one memory cell, these transistors T are connected together to form the memory cell string 400. One transistor T (e.g., each transistor T) may be formed by a semiconductor channel layer 211 and a gate G surrounding the semiconductor channel layer 211. The gate G is configured to control the on state of the transistor T.

It should be noted that, the number of transistors in FIG. 1, FIG. 2 and FIG. 3 is merely illustrative, the memory cell string 400 of the semiconductor structure 100 provided in the examples of the present disclosure may further include other numbers of transistors, such as 4, 16, 32 and 64.

Referring to FIG. 2 and FIG. 3, in the third direction Z, the gate at the lowermost side in a plurality of gates G (e.g., the gate closest to the source layer SL in the plurality of gate G) may be configured as a source terminal selection gate SGS, which is configured to control the on state of the transistor T6, so as to control the on state of one source terminal channel in the memory cell string 400.

Referring to FIG. 2 and FIG. 3, the gate at the uppermost side in the plurality of gate G (e.g., the gate farthest away from the source layer SL in the plurality of gate G) may be configured as a drain terminal selection gate SGD, which is configured to control the on state of the transistor T1, so as to control the on state of one drain terminal channel in the memory cell string 400.

Referring to FIG. 2 and FIG. 3, the gates at the middle in the plurality of gates G may be configured as a plurality of word lines WL, for example, including a word line WL0, a word line WL1, a word line WL2 and a word line WL3. Data writing, reading, and erasing of each memory cell (e.g., the transistor T) in the memory cell string 400 may be completed by writing different voltages on the word lines WL.

In some examples, referring to FIG. 1, the semiconductor structure 100 may further include an array interconnection layer 300. The array interconnection layer 300 may be coupled with the memory cell string 400.

As shown in FIG. 1, FIG. 2 and FIG. 3, the array interconnection layer 300 may include a drain terminal (i.e., the bit line BL) of the memory cell string 400, the drain terminal may be coupled with the semiconductor channel layer 211 of each transistor T in at least one memory cell string 400.

Exemplarily, as shown in FIG. 1 and FIG. 2, the array interconnection layer 300 may include one or more first interlayer insulating layer S310, and may further include a plurality of contacts that are insulated from each other by these first interlayer insulating layer S310, the contacts include, for example, a bit line contact BL-CNT coupled with the bit line BL; a drain terminal selection gate contact SGD-CNT coupled with the drain terminal selection gate SGD.

The material of the first interlayer insulating layer 310 is an insulating material, including at least one of silicon oxide, silicon nitride, silicon oxynitride, doped silicon oxide, organosilicate glass, dielectric metal oxide (e.g, aluminum oxide, hafnium dioxide and the like) and silicate thereof, and organic insulating material, the present disclosure is not limited thereto.

As shown in FIG. 1 and FIG. 2, the array interconnection layer 300 may further include one or more first interconnection conductor layer S320. The first interconnection conductor layer 320 may include a plurality of connecting lines, such as a bit line BL and a word line connecting line coupled with the word line WL.

The material of the first interconnection conductor layer 320 and the contact may be a conductive material, for example, one or more combination of tungsten, cobalt, copper, aluminum, and metal silicide, and may also be other suitable materials.

As shown in FIG. 1, the peripheral interconnection layer 203 may be coupled with the array interconnection layer 300, so that the semiconductor structure 100 is coupled with the peripheral device 200.

Here, since the peripheral interconnection layer 203 is coupled with the array interconnection layer 300, the peripheral circuit in the peripheral device 200 may be coupled with the memory cell string 400 in the semiconductor structure 100, so as to realize the transmission of an electrical signal between the peripheral circuit and the memory cell string 400.

In some possible implementations, referring to FIG. 1 and FIG. 2, a bonding interface 500 may be disposed between the peripheral interconnection layer 203 and the array interconnection layer 300, the peripheral interconnection layer 203 and the array interconnection layer 300 may be bonded and coupled with each other by the bonding interface 500.

As the number of 3D NAND layers increases, the process difficulty of etching contact holes for leading out gate layers becomes higher and higher. To reduce the process difficulty, a 3D NAND of a self-align contact (SCT) architecture is proposed.

However, as the number of 3D NAND layers increases, the number of SCTs increases, the total area occupied by all SCTs increases, so that the area of the connection region is increased, the area of the memory region is correspondingly reduced, the memory density is reduced. Based on this, how to form more SCTs for leading out the gate layers without increasing the area of the connection region is a problem that needs to be solved at present.

Figure 27:
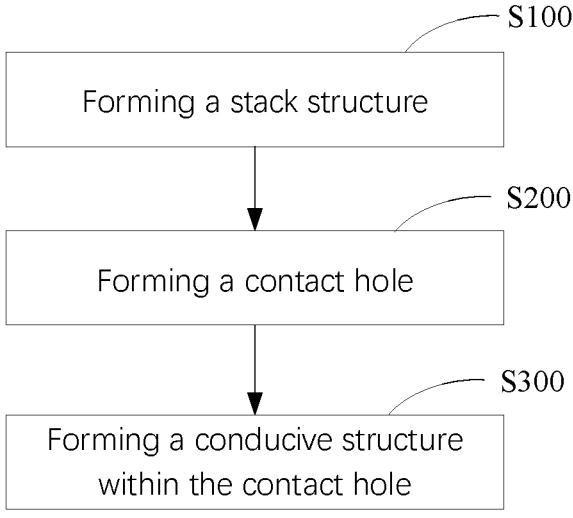
FIG. 27 to FIG. 35 are flow charts of a fabrication method of a semiconductor structure according to some examples.

Based on this, the examples of the present disclosure provide a fabrication method of a semiconductor structure, as shown in FIG. 27, the fabrication method includes S100-S300.

Figure 8:
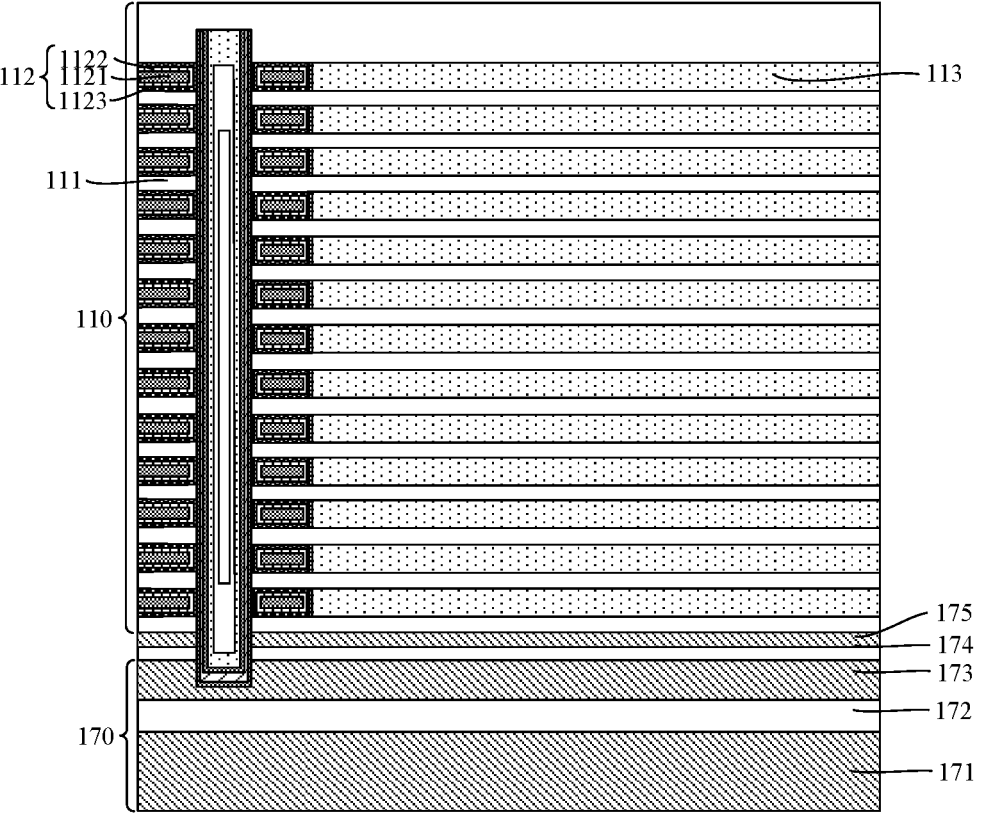
FIG. 8 to FIG. 17 are diagrams illustrating a fabrication method of a semiconductor structure according to some examples.

S100: referring to FIG. 8, a stack structure 110 is formed.

Figure 5:
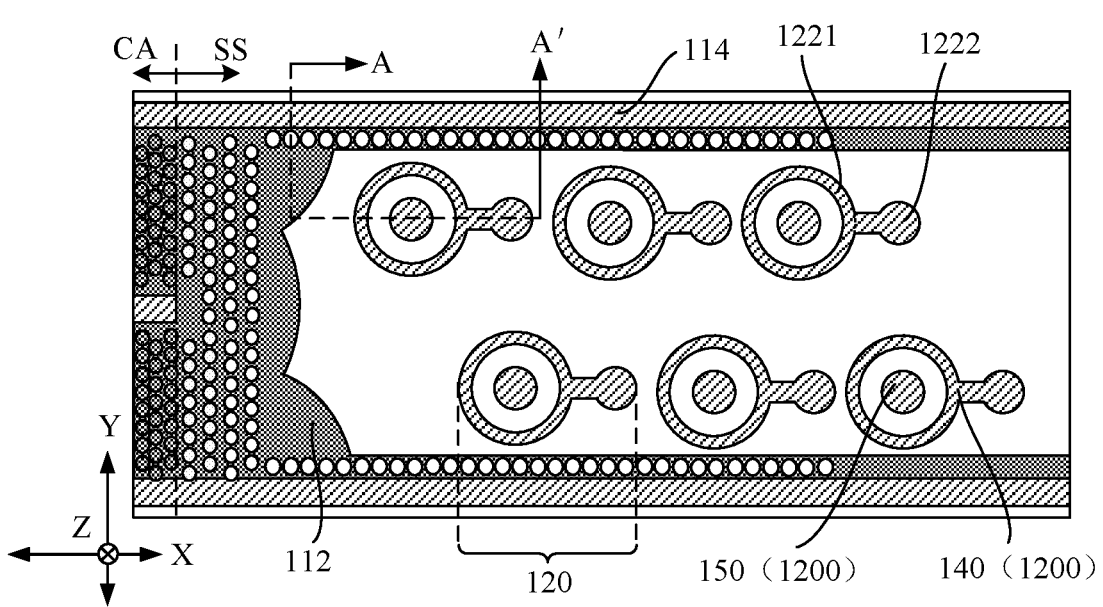
FIG. 5 is a top view of yet another semiconductor structure according to some examples.

In the above, as shown in FIG. 5 and FIG. 8, the stack structure 110 includes a plurality of first dielectric layers 111 and gate layers 112 which are alternately disposed. The stack structure 110 has a memory region CA and a connection region SS, the stack structure 110 further includes a plurality of first dielectric layers 111 and second dielectric layers 113 which are alternately disposed in the connection region SS.

That is, the gate layer 112 and the second dielectric layer 113 are disposed on the same layer, and the gate layer 112 is at least located in the memory region CA, for example, the gate layer 112 partially extends from the memory region CA to the connection region SS. The second dielectric layer 113 is located in the connection region SS.

The material of the first dielectric layer 111 may include an insulating material, including at least one of silicon oxide, silicon nitride, silicon oxynitride, doped silicon oxide, organosilicate glass, dielectric metal oxide (e.g., aluminum oxide, hafnium dioxide and the like) and silicate thereof, and organic insulating material.

The material of the second dielectric layer 113 may include an insulating material, including at least one of silicon oxide, silicon nitride, silicon oxynitride, doped silicon oxide, organosilicate glass, dielectric metal oxide (e.g., aluminum oxide, hafnium dioxide and the like) and silicate thereof, and organic insulating material.

It should be noted that, the material of the first dielectric layer 111 is different from the material of the second dielectric layer 113, so that the first dielectric layer 111 and the second dielectric layer 113 have different etching selection ratios for the same etchant. Exemplarily, the material of the first dielectric layer 111 is silicon dioxide, the material of the second dielectric layer 113 is silicon nitride.

Referring to FIG. 8, the gate layer 112 includes a conductive layer 1121, the material of the conductive layer 1121 may include a conductive material, for example, at least one of tungsten, cobalt, copper, aluminum, doped silicon, and silicide.

In some examples, as shown in FIG. 8, the gate layer 112 may further include a metal compound layer 1122 which encloses the conductive layer 1121, the metal compound layer 1122 is used for improving an adhesive force between the conductive layer 1121 and the first dielectric layer 111, wherein the material of the metal compound layer 1122 includes at least one of titanium nitride, tantalum nitride and tungsten carbide.

In some examples, as shown in FIG. 8, the gate layer 112 may further include a third dielectric layer 1123 which encloses the metal compound layer 1122 to reduce the risk of charges in the memory cell string 400 (see FIG. 2) flowing to the conductive layer 1121, wherein the dielectric constant value of the third dielectric layer 1123 is greater than or equal to 7. Exemplarily, the material of the third dielectric layer 1123 includes at least one of aluminum oxide, hafnium oxide and tantalum oxide.

As shown in FIG. 8, the stack structure 110 may be formed on a substrate 170. The substrate 170 may be used for supporting the stack structure 110 thereon, may be removed in subsequent processes and form the source layer SL (see FIG. 1).

In some examples, referring to FIG. 8, the substrate 170 may be a composite substrate.

Exemplarily, as shown in FIG. 8, the substrate 170 may include a base 171, and a sacrificial silicon oxide layer 172 and a sacrificial polysilicon layer 173 formed on the matrix 171 in sequence.

The material of the base 171 may include at least one of monocrystalline silicon, polysilicon, monocrystalline germanium, III-V compound semiconductor material, II-VI compound semiconductor material, and other semiconductor materials known in the art; the material of the sacrificial silicon oxide layer 172 may include silicon oxide; the material of the sacrificial polysilicon layer 173 may include polysilicon.

In addition, referring to FIG. 8, other functional layers may be disposed between the stack structure 110 and the substrate 170, the stack structure 110 may also be directly disposed on the substrate 170.

Figure 7:
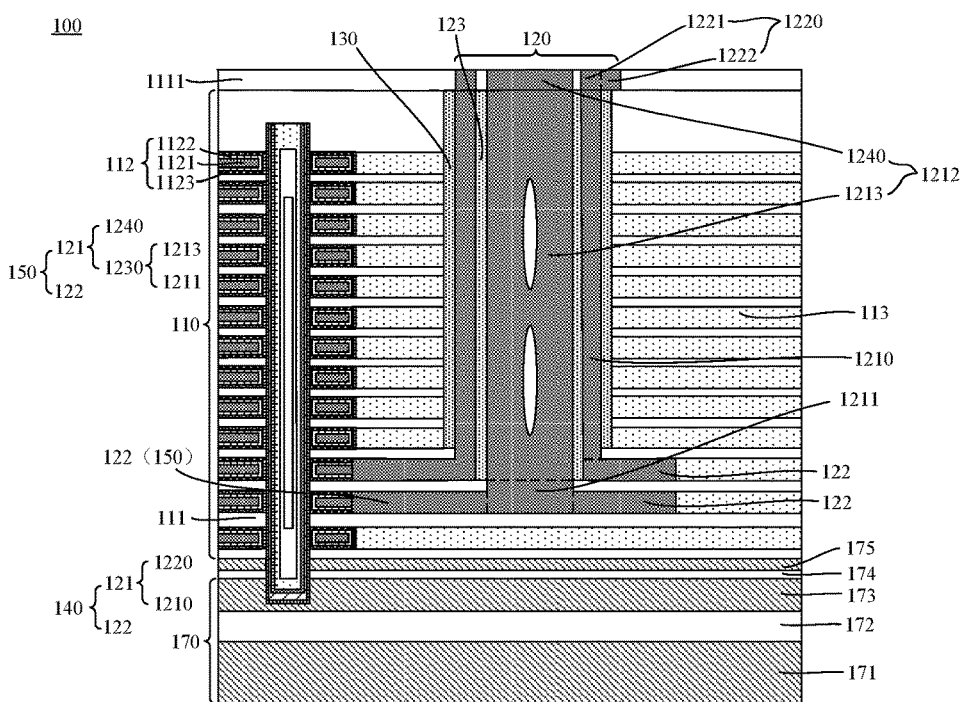
FIG. 7 is another sectional view taken along the section line A-A' in FIG. 5.

Exemplarily, as shown in FIG. 7, a semiconductor layer 174 and a fourth dielectric layer 175 are further disposed between the stack structure 110 and the substrate 170, the semiconductor layer 174 is located on a side of the fourth dielectric layer 175 far away from the substrate 170.

The material of the semiconductor layer 174 includes a semiconductor material, for example, monocrystalline silicon, polysilicon, monocrystalline germanium, III-V compound semiconductor material, II-VI compound semiconductor materials, and other suitable semiconductor materials. The material of the fourth dielectric layer 175 includes an insulating material, which may include at least one of silicon oxide, silicon nitride, silicon oxynitride, doped silicon oxide, organosilicate glass, dielectric metal oxide (e.g., aluminum oxide, hafnium dioxide and the like) and silicate thereof, and organic insulating material.

In some examples, for example, the S100 may include: forming an initial stack structure; forming a channel structure 210 (see FIG. 1) and a dummy channel structure 220 (see FIG. 1) penetrating through the initial stack structure; forming a gate line slit penetrating through the initial stack structure; replacing part of the second dielectric layer 113 (see FIG. 8) with the gate layer 112 (see FIG. 8) via the gate line slit. Furthermore, after the gate layer 112 is formed, a gate line isolation structure 114 may be formed within the gate line slit (see FIG. 1).

It should be noted that, the initial stack structure includes a plurality of first dielectric layers 111 and a plurality of second dielectric layers 113 which are alternately disposed.

Referring to FIG. 1 and FIG. 2, the channel structure 210 and the dummy channel structure 220 may each include, for example, a semiconductor channel layer 211 and a memory functional layer 212, the memory functional layer 212 is disposed around the semiconductor channel layer 211.

The material of the semiconductor channel layer 211 includes a semiconductor material, such as monocrystalline silicon, polysilicon, monocrystalline germanium, III-V compound semiconductor material, II-VI compound semiconductor material, and other suitable semiconductor materials.

The memory functional layer 212 may include, for example, a blocking layer 2121, a charge trap layer 2122 and a tunneling layer 2123, the materials of the blocking layer, the charge trap layer, the tunneling layer and the semiconductor channel layer may be silicon oxide, silicon nitride, silicon oxide and polysilicon respectively, so as to form an "ONOP" structure.

In some examples, referring to FIG. 2, the channel structure 210 and the dummy channel structure 220 may further include a channel filling layer 213, which is disposed on a side of the semiconductor channel layer 211 far away from the memory functional layer 212, so as to provide a mechanical support effect.

The material of the channel filling layer 213 includes an insulating material, which may include at least one of silicon oxide, silicon nitride, silicon oxynitride, doped silicon oxide, organosilicate glass, dielectric metal oxide (e.g., aluminum oxide, hafnium dioxide and the like) and silicate thereof, and organic insulating material.

In some examples, referring to FIG. 1, the gate line isolation structure 114 includes an insulating isolation portion 1141, which is in contact with the stack structure 110.

It should be noted that, the material of the insulating isolation portion 1141 includes an insulating material, which may include, for example, at least one of silicon oxide, silicon nitride, silicon oxynitride, doped silicon oxide, organosilicate glass, dielectric metal oxide (e.g., aluminum oxide, hafnium dioxide and the like) and silicate thereof, and organic insulating material.

On this basis, as shown in FIG. 1, the gate line isolation structure 114 may further include a gate line filling layer 1142. A cavity is reserved inside the insulating isolation portion 1141, the gate line filling layer 1142 fills the cavity, so as to provide a mechanical support effect.

It should be noted that, the material of the gate line filling layer 1142 may be a conductive material, and may also be an insulating material, which is not specifically limited here in the present disclosure.

Figure 9:
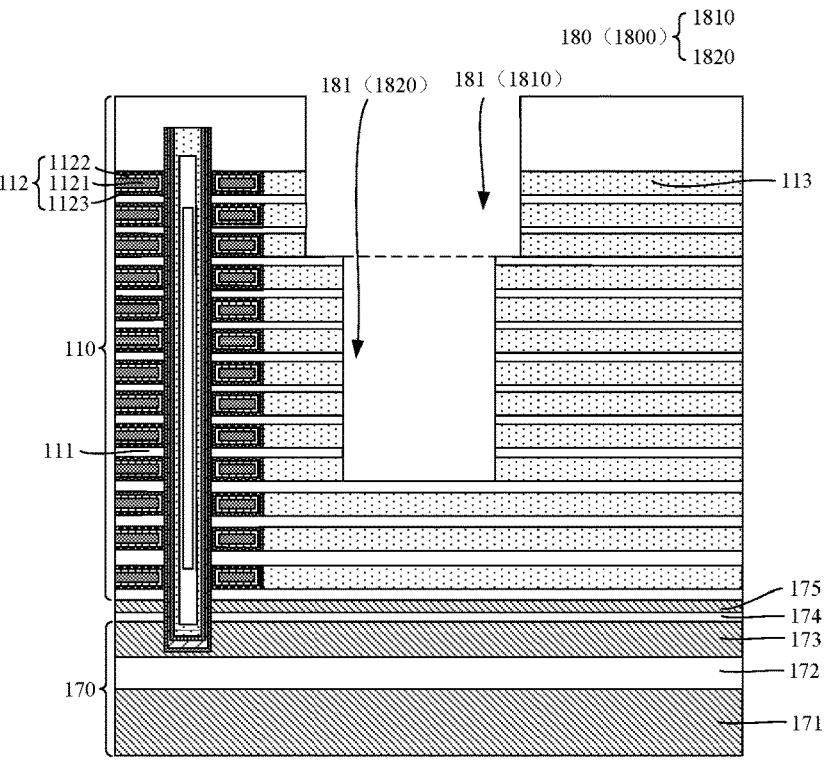

S200: referring to FIG. 9, a contact hole 180 is formed.

In the above, as shown in FIG. 5 and FIG. 9, the contact hole 180 is located in the connection region SS, wherein the contact hole 180 includes a plurality of sub-holes 1800, each sub-hole 1800 includes a first hole segment 181 penetrating to the upper surface of the first dielectric layer 111 above and adjacent to a corresponding gate layer 112, and in any two sub-holes 1800, an orthographic projection of the first hole segment 181 of one sub-hole 1800 on a reference plane is located within an orthographic projection of the first hole segment 181 of the other sub-hole 1800 on the reference plane.

It should be noted that, the reference plane is a plane where the lower surface of the stack structure 110 is located.

In some examples, referring to FIG. 9, the sub-holes 1800 include a first sub-hole 1810 and a second sub-hole 1820, the first sub-hole 1810 includes a first hole segment 181, the second sub-hole 1820 includes a first hole segment 181.

Figure 28:
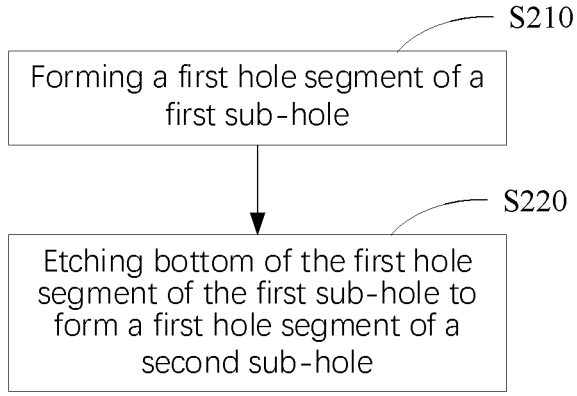

At this time, referring to FIG. 28, S200 includes S210-S220.

S210: referring to FIG. 9, the first hole segment 181 of the first sub-hole 1810 is formed.

In the above, the first hole segment 181 of the first sub-hole 1810 extends to the upper surface of the first dielectric layer 111 above and adjacent to the gate layer 112 corresponding to the first sub-hole 1810.

A photoresist pattern may be formed on the upper surface of the stack structure 110 by coating, exposure, and development processes. Then, based on the photoresist pattern, the stack structure 110 is etched by a dry/wet etching process, so as to form the first hole segment 181 of the first sub-hole 1810. For example, the stack structure 110 is isotropically etched to form the first hole segment 181 of the first sub-hole 1810 by using a wet etching process. Finally, the photoresist pattern is stripped off.

S220: referring to FIG. 9, the bottom of the first hole segment 181 of the first sub-hole 1810 is etched to form the first hole segment 181 of the second sub-hole 1820.

In the above, the first hole segment 181 of the second sub-hole 1820 extends to the upper surface of the first dielectric layer 111 above and adjacent to the gate layer 112 corresponding to the second sub-hole 1820. The ortho-graphic projection of the first hole segment 181 of the second sub-hole 1820 on the reference plane is located within an orthographic projection of the first hole segment 181 of the first sub-hole 1810 on the reference plane.

Photoresist patterns may be formed on the upper surface of the stack structure 110 and the bottom of the first hole segment 181 of the first sub-hole 1810 by coating, exposure, and development processes. Then, based on the photoresist patterns, the bottom of the first hole segment 181 of the first sub-hole 1810 is etched by a dry/wet etching process, so as to form the first hole segment 181 of the second sub-hole 1820. For example, the bottom of the first hole segment 181 of the first sub-hole 1810 is isotropically etched to form the first hole segment 181 of the second sub-hole 1820 by using a wet etching process. Finally, the photoresist patterns are stripped off.

Figure 19:
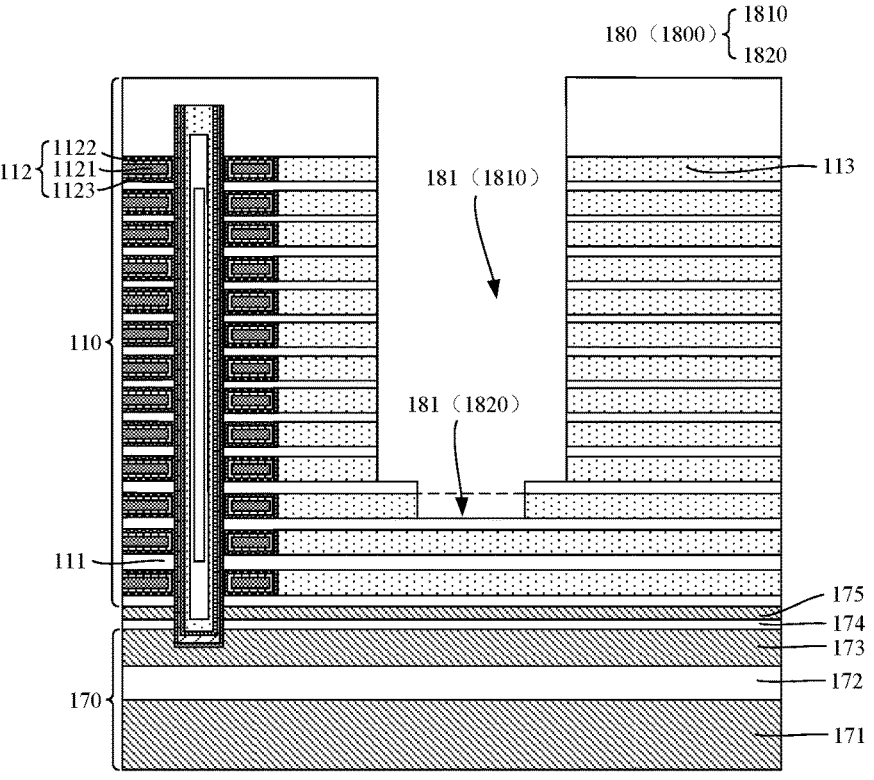

It should be noted that, as shown in FIG. 9, there may be at least one gate layer 112 between the gate layer 112 corresponding to the first sub-hole 1810 and the gate layer 112 corresponding to the second sub-hole 1820. As shown in FIG. 19, there may also be no gate layer 112 between the gate layer 112 corresponding to the first sub-hole 1810 and the gate layer 112 corresponding to the second sub-hole 1820, that is, the gate layer 112 corresponding to the second sub-hole 1820 is the gate layer 112 below and adjacent to the gate layer 112 corresponding to the first sub-hole 1810.

Figure 29:
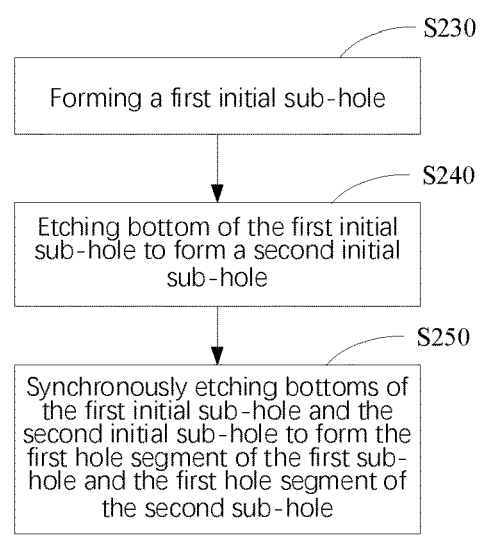

In other examples, referring to FIG. 29, S200 includes S230-S250.

The stack structure 110 includes N first dielectric layers 111 from the upper surface to the lower surface of the stack structure 110, the N first dielectric layers 111 are the first to Nth first dielectric layers 111, respectively. Here, N>2, and N is an integer, that is, N is an integer greater than 1.

Figure 18:
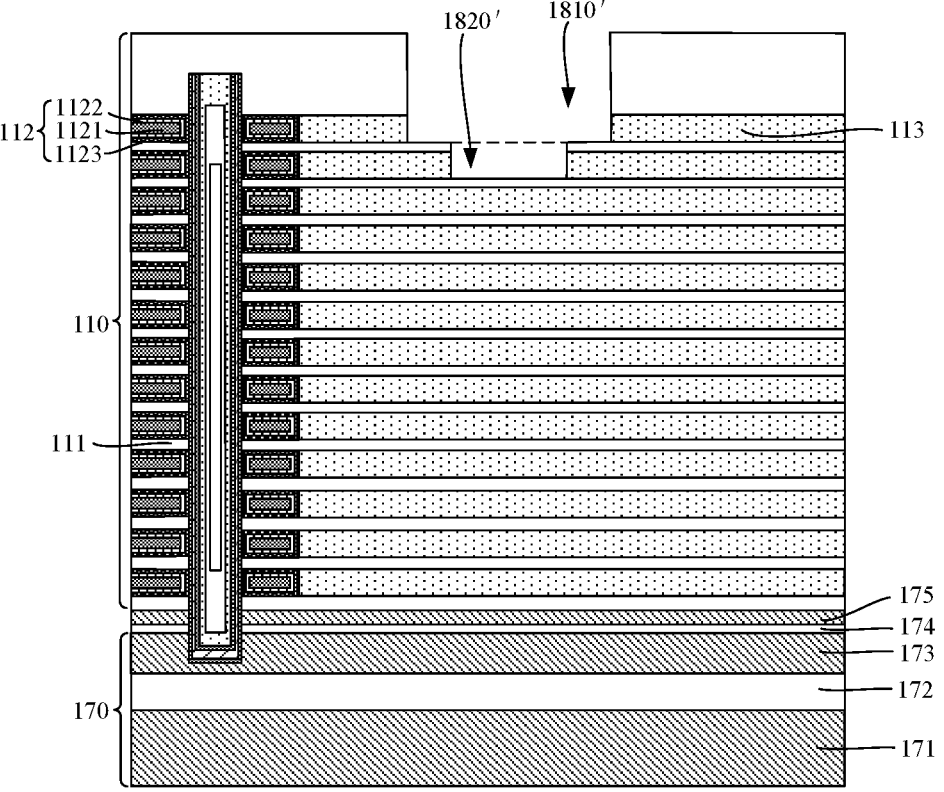
FIG. 18 to FIG. 26 are diagrams illustrating another fabrication method of a semiconductor structure according to some examples.

S230: referring to FIG. 18, a first initial sub-hole 1810' is formed.

In the above, as shown in FIG. 18, the first initial sub-hole 1810' extends to the upper surface of the second first dielectric layer 111.

A photoresist pattern may be formed on the upper surface of the stack structure 110 by coating, exposure, and development processes. Then, based on the photoresist pattern, the stack structure 110 is etched by a dry/wet etching process, so as to form the first initial sub-hole 1810'. For example, the stack structure 110 is isotropically etched to form the first initial sub-hole 1810' by using a wet etching process. Finally, the photoresist pattern is stripped off.

S240: referring to FIG. 18, the bottom of the first initial sub-hole 1810' is etched to form a second initial sub-hole 1820'.

In the above, as shown in FIG. 18, the second initial sub-hole 1820' extends to the upper surface of the third first dielectric layer 111.

Photoresist patterns may be formed on the upper surface of the stack structure 110 and the bottom of the first initial sub-hole 1810' by coating, exposure, and development processes. Then, based on the photoresist patterns, the bottom of the first initial sub-hole 1810' is etched by a dry/wet etching process, so as to form the second initial sub-hole 1820'. For example, the bottom of the first initial sub-hole 1810' is isotropically etched to form the second initial sub-hole 1820' by using a wet etching process. Finally, the photoresist patterns are stripped off.

S250: referring to FIG. 18 and FIG. 19, the bottoms of the first initial sub-hole 1810' and the second initial sub-hole 1820' are synchronously etched to form the first hole segment 181 of the first sub-hole 1810 and the first hole segment 181 of the second sub-hole 1820.

In the above, both the first hole segment 181 of the first sub-hole 1810 and the first hole segment 181 of the second sub-hole 1820 extend to the upper surfaces of the first dielectric layers 111 above and adjacent to corresponding gate layers 112.

Figure 30:
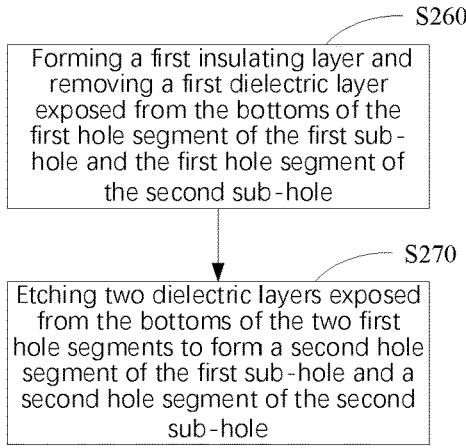

In addition, referring to FIG. 30, the S200 may further include S260-S270.

Figure 11:
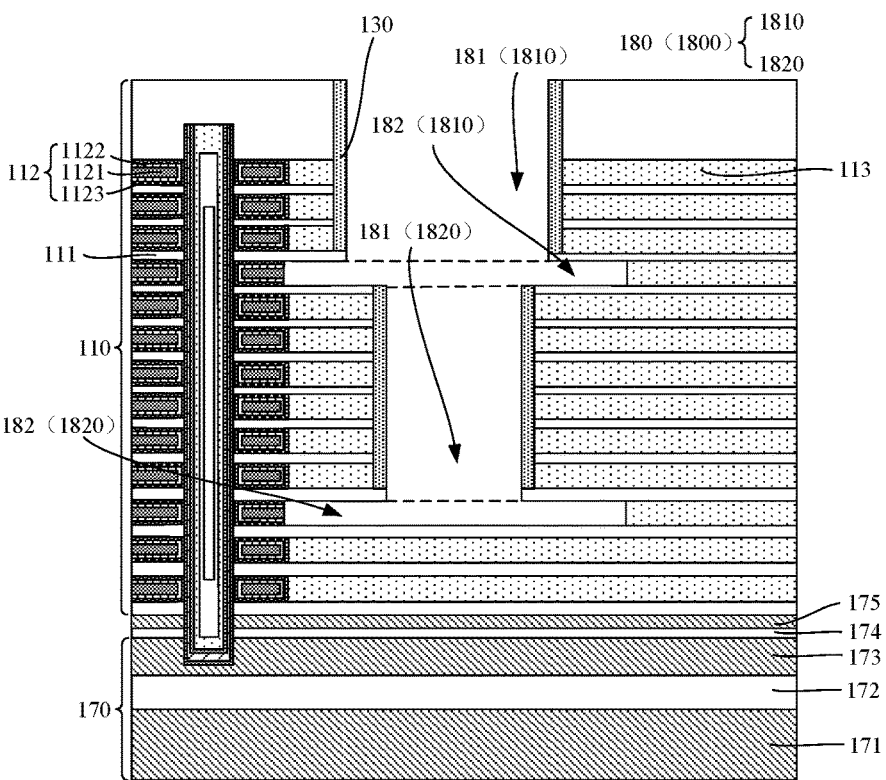

S260: referring to FIG. 11, a first insulating layer 130 is formed, and the first dielectric layers 111 exposed from the bottoms of the first hole segment 181 of the first sub-hole 1810 and the first hole segment 181 of the second sub-hole 1820 are removed.

In the above, the first insulating layer 130 covers the side walls of the first hole segment 181 of the first sub-hole 1810 and the first hole segment 181 of the second sub-hole 1820.

The material of the first insulating layer 130 may include an insulating material, including at least one of silicon oxide, silicon nitride, silicon oxynitride, doped silicon oxide, organosilicate glass, dielectric metal oxide (e.g., aluminum oxide, hafnium dioxide and the like) and silicate thereof, and organic insulating material.

Figure 31:
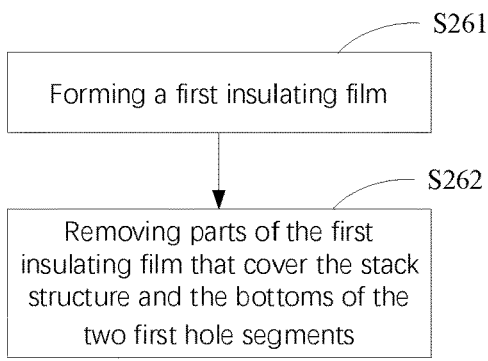

In some examples, referring to FIG. 31, S260 includes S261-S262.

Figure 10:
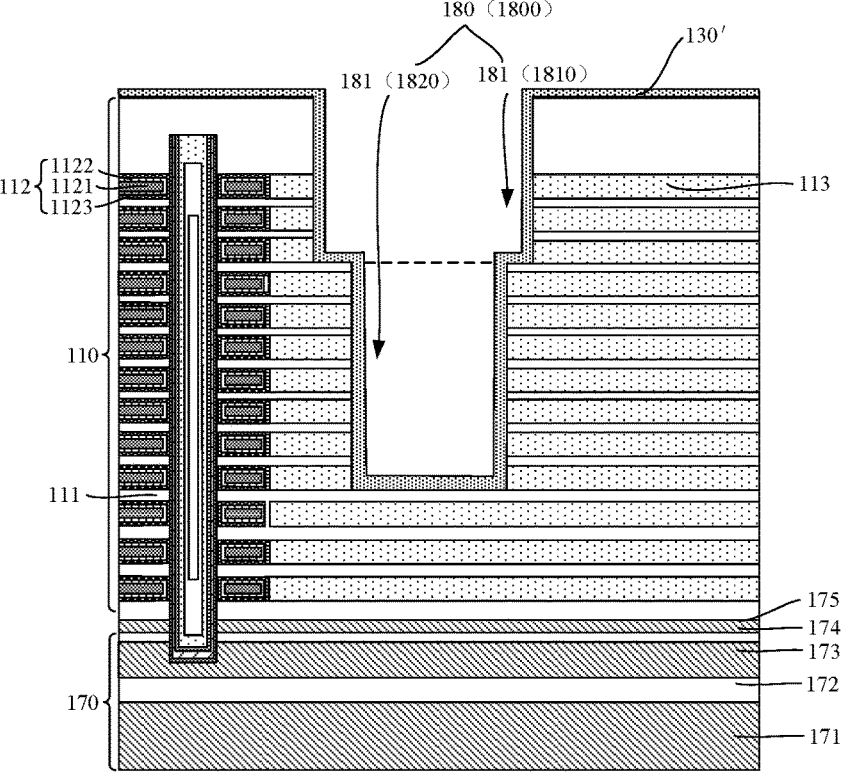

S261: referring to FIG. 10, a first insulating film 130' is formed.

In the above, the first insulating film 130' covers the stack structure 110, the upper surfaces of two first dielectric layers 111 exposed from the bottoms of two first hole segments 181, and the side walls of the two first hole segments 181.

It should be noted that, the two first hole segments 181 are the first hole segment 181 of the first sub-hole 1810 and the first hole segment 181 of the second sub-hole 1820.

S262: referring to FIG. 10 and FIG. 11, parts of the first insulating film 130' that cover the stack structure 110 and the bottoms of the two first hole segments 181 are removed.

In the above, remaining parts of the first insulating film 130' in the two first hole segments 181 form the first insulating layer 130.

The material of the first insulating film 130' may be same as the material of the first dielectric layer 111, for example, both the material of the first insulating film 130' and the material of the first dielectric layer 111 are silicon dioxide. At this time, during the process of S262, the first dielectric layers 111 exposed from the bottoms of the first hole segment 181 of the first sub-hole 1810 and the first hole segment 181 of the second sub-hole 1820 are removed simultaneously, so as to expose the second dielectric layer 113.

S270: referring to FIG. 11, two second dielectric layers 113 exposed from the bottoms of the two first hole segments 181 are etched to form a second hole segment 182 of the first sub-hole 1810 and a second hole segment 182 of the second sub-hole 1820.

In the above, the second hole segment 182 of the first sub-hole 1810 exposes the corresponding gate layer 112, the second hole segment 182 of the second sub-hole 1820 exposes the corresponding gate layer 112.

Here, two second dielectric layers 113 exposed from the bottoms of the two first hole segments 181 are etched simultaneously by using the two first hole segments 181 as etchant channels, so as to form the second hole segment 182 of the first sub-hole 1810 and the second hole segment 182 of the second sub-hole 1820.

Exemplarily, the two second dielectric layers 113 exposed from the bottoms of the two first hole segments 181 may be etched by using a dry/wet etching process. For example, the two second dielectric layers 113 exposed from the bottoms of the two first hole segments 181 are anisotropically etched by using a dry etching process, so as to form the second hole segment 182 of the first sub-hole 1810 and the second hole segment 182 of the second sub-hole 1820.

In addition, when the gate layer 112 includes the metal compound layer 1122 and the third dielectric layer 1123, during the process of S270, the third dielectric layer 1123 and the metal compound layer 1122 of the gate layer 112 that are exposed within the second hole segment 182 are also removed in sequence.

Figure 6:
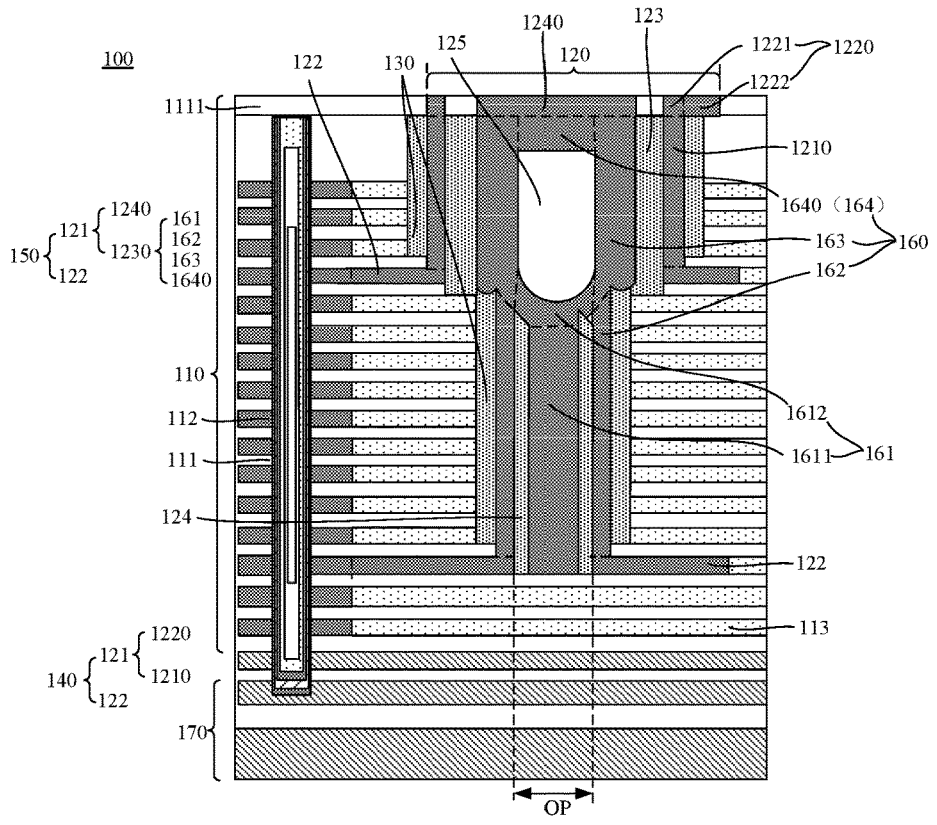
FIG. 6 is a sectional view taken along a section line A-A' in FIG. 5.

S300: referring to FIG. 6 and FIG. 11, a conductive structure 120 is formed within the contact hole 180.

In the above, as shown in FIG. 5 and FIG. 6, the conductive structure 120 includes a plurality of conductive portions 1200 insulated from each other, each conductive portion 1200 penetrates through a part of the stack structure 110 and is connected with the gate layer 112, wherein parts of the plurality of conductive portions 1200 that penetrate through the stack structure 1100 are sequentially disposed in a nested manner, and the gate layers 112 connected with the plurality of conductive portions 1200 are located on different layers.

The material of the conductive portion 1200 may include a conductive material, for example, at least one of tungsten, cobalt, copper, aluminum, doped silicon, and silicide.

It should be noted that, each gate layer 112 is electrically connected with a corresponding word line connecting line by one conductive portion 1200, that is, each gate layer 112 is correspondingly connected with one conductive portion 1200. Here, the conductive portion 1200 is connected with the corresponding gate layer 112.

Figure 32:
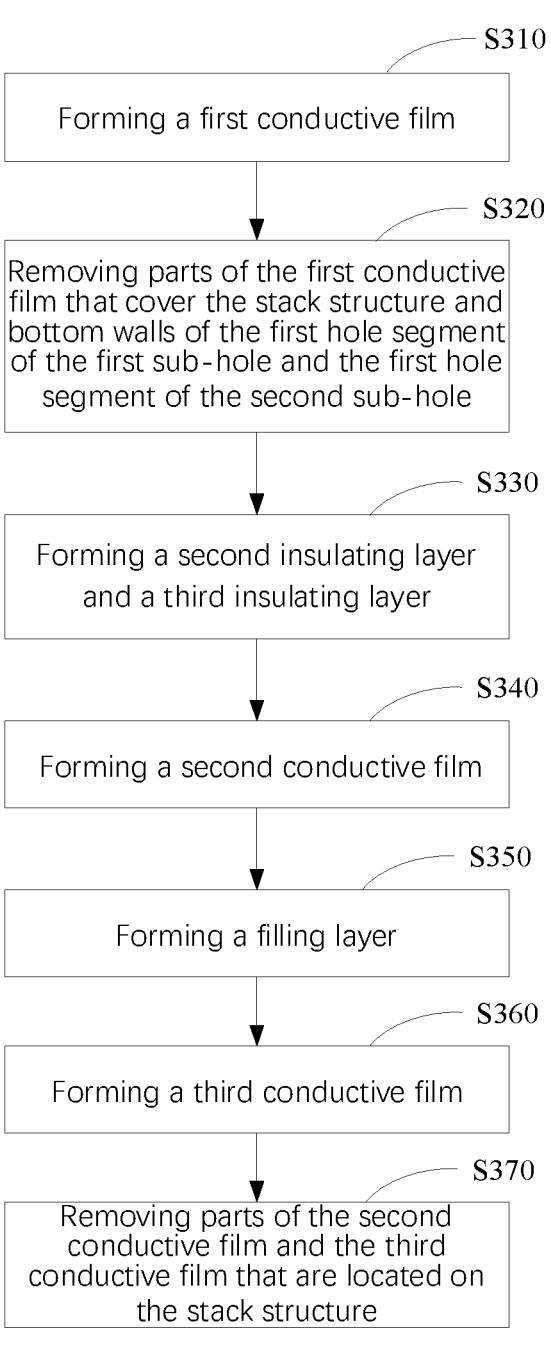

In some examples, referring to FIG. 32, S300 includes S310-S370.

There may be at least one gate layer 112 between the second hole segment 182 of the first sub-hole 1810 and the second hole segment 182 of the second sub-hole 1820, there may also be no gate layer 112 between the second hole segment 182 of the first sub-hole 1810 and the second hole segment 182 of the second sub-hole 1820.

In FIG. 6 and FIG. 11 to FIG. 17, it is exemplarily described that S300 includes S310-S370 in the examples of the present disclosure are by taking it as an example that there is at least one gate layer between the second hole segment of the first sub-hole and the second hole segment of the second sub-hole.

Figure 12:
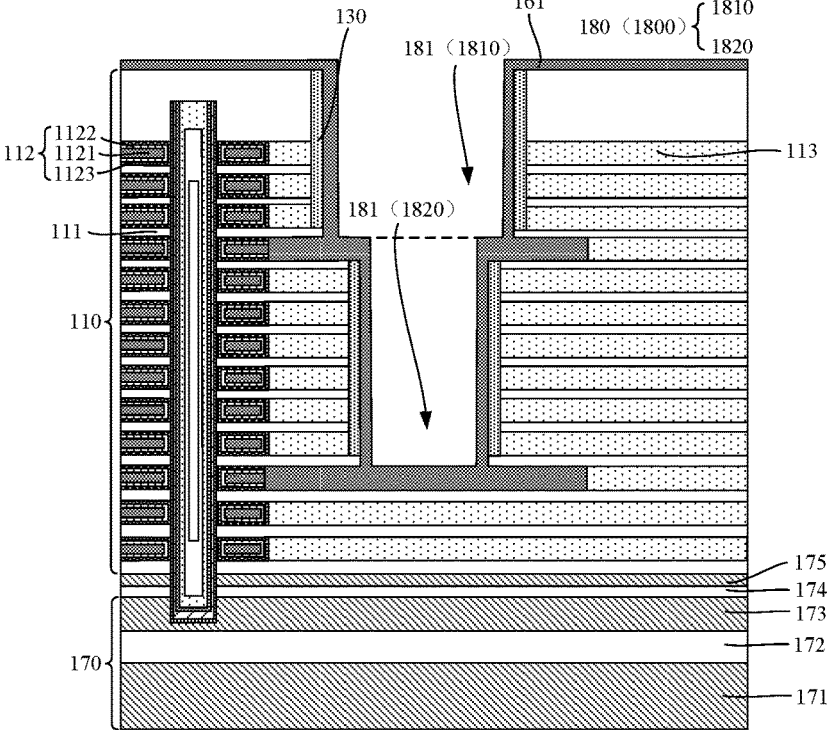

S310: referring to FIG. 11 and FIG. 12, a first conductive film 161' is formed.

In the above, the first conductive film 161' covers the stack structure 110 and the side walls and bottom walls of the first hole segment 181 of the first sub-hole 1810 and the first hole segment 181 of the second sub-hole 1820, and fills the second hole segment 182 of the first sub-hole 1810 and the second hole segment 182 of the second sub-hole 1820, wherein the first conductive film 161' may be formed by using any film deposition process of chemical vapor deposition (CVD), physical vapor deposition (PVD), and atomic layer deposition (ALD).

The material of the first conductive film 161' may include a conductive material, for example, at least one of tungsten, cobalt, copper, aluminum, doped silicon, and silicide.

Figure 13:
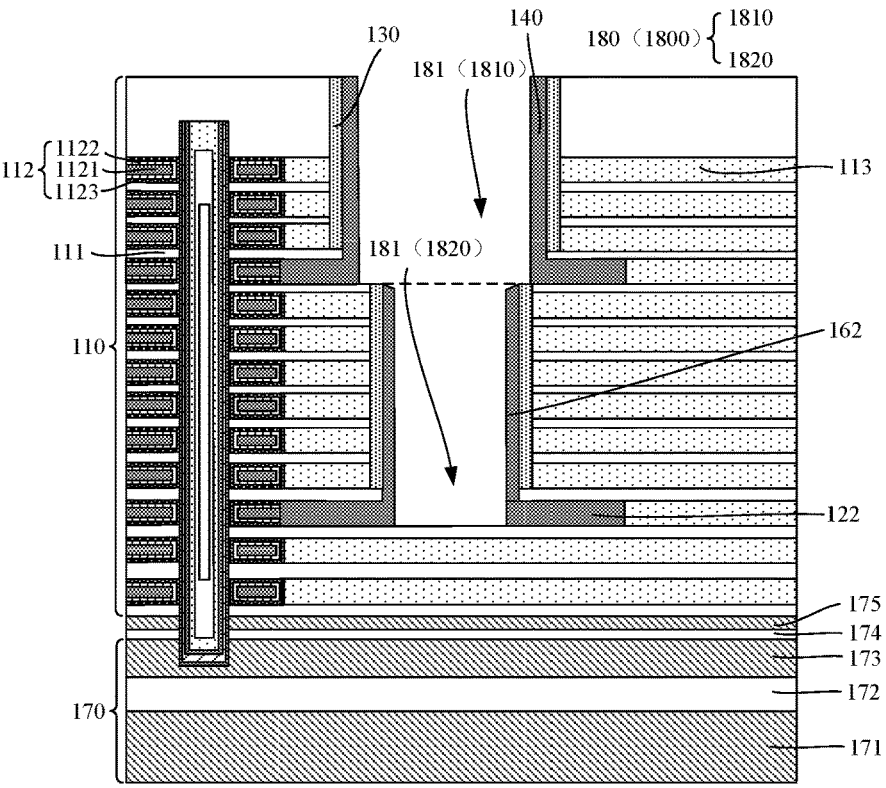

S320: referring to FIG. 12 and FIG. 13, parts of the first conductive film 161' that cover the stack structure 110, the bottom walls of the first hole segment 181 of the first sub-hole 1810 and the first hole segment 181 of the second sub-hole 1820 are removed.

In the above, as shown in FIG. 13, the bottom of the first sub-hole 1810 exposes the first insulating layer 130 in the second sub-hole 1820 and a first portion 162 of a connecting pillar 160. The bottom of the second sub-hole 1820 exposes the first dielectric layer 111.

In conjunction with FIG. 6, FIG. 12 and FIG. 13, part of the first conductive film 161' remaining in the first sub-hole 1810 forms a first conductive portion 140. Part of the first conductive film 161' remaining in the first hole segment 181 of the second sub-hole 1820 forms the first portion 162 of the connecting pillar 160, the first portion 162 penetrates through a film layer between the gate layer 112 connected with the first conductive portion 140 and the gate layer 112 connected with a second conductive portion 150, and the first portion 162 forms a cylindrical structure in a surrounding manner. Part of the first conductive film 161' remaining in the second hole segment 182 of the second sub-hole 1820 forms a second conductive sub-portion 122 of the second conductive portion 150.

The first conductive film 161' may be etched by a dry/wet etching process. For example, the first conductive film 161' is anisotropically etched by using a dry etching process, so as to form the first conductive portion 140, the first portion 162 of the connecting pillar 160, and the second conductive sub-portion 122 of the second conductive portion 150.

Figure 15:
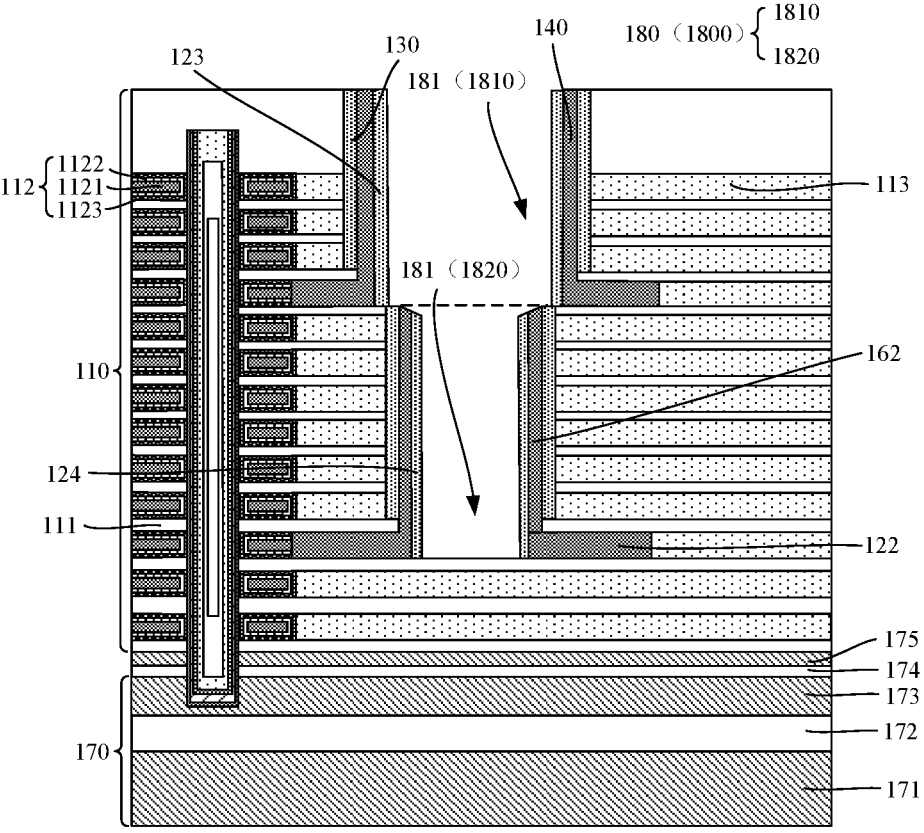

S330: referring to FIG. 15, a second insulating layer 123 and a third insulating layer 124 are formed.

In the above, the second insulating layer 123 covers the side wall of the first hole segment 181 of the first sub-hole 1810, and exposes the upper end of the first portion 162. The third insulating layer 124 covers the side wall of the first hole segment 181 of the second sub-hole 1820, that is, the side wall of the cylindrical structure which is formed by the first portion 162 in the first hole segment 181 of the second sub-hole 1820 in a surrounding manner.

The material of the second insulating layer 123 may include an insulating material, including at least one of silicon oxide, silicon nitride, silicon oxynitride, doped silicon oxide, organosilicate glass, dielectric metal oxide (e.g., aluminum oxide, hafnium dioxide and the like) and silicate thereof, and organic insulating material.

The material of the third insulating layer 124 may include an insulating material, including at least one of silicon oxide, silicon nitride, silicon oxynitride, doped silicon oxide, organosilicate glass, dielectric metal oxide (e.g., aluminum oxide, hafnium dioxide and the like) and silicate thereof, and organic insulating material.

The materials of the first dielectric layer 111, the first insulating layer 130, the second insulating layer 123 and the third insulating layer 124 may be different, may also be the same. Exemplarily, the materials of the first dielectric layer 111, the first insulating layer 130, the second insulating layer 123 and the third insulating layer 124 are the same. For example, each of the materials of the first dielectric layer 111, the first insulating layer 130, the second insulating layer 123 and the third insulating layer 124 is silicon dioxide.

Figure 33:
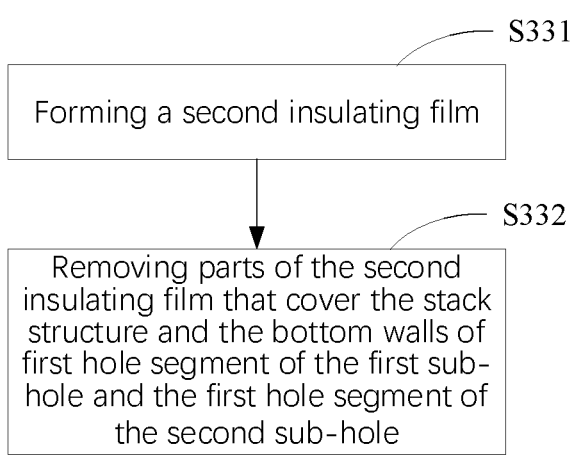

In some examples, referring to FIG. 33, S330 includes S331-S332.

Figure 14:
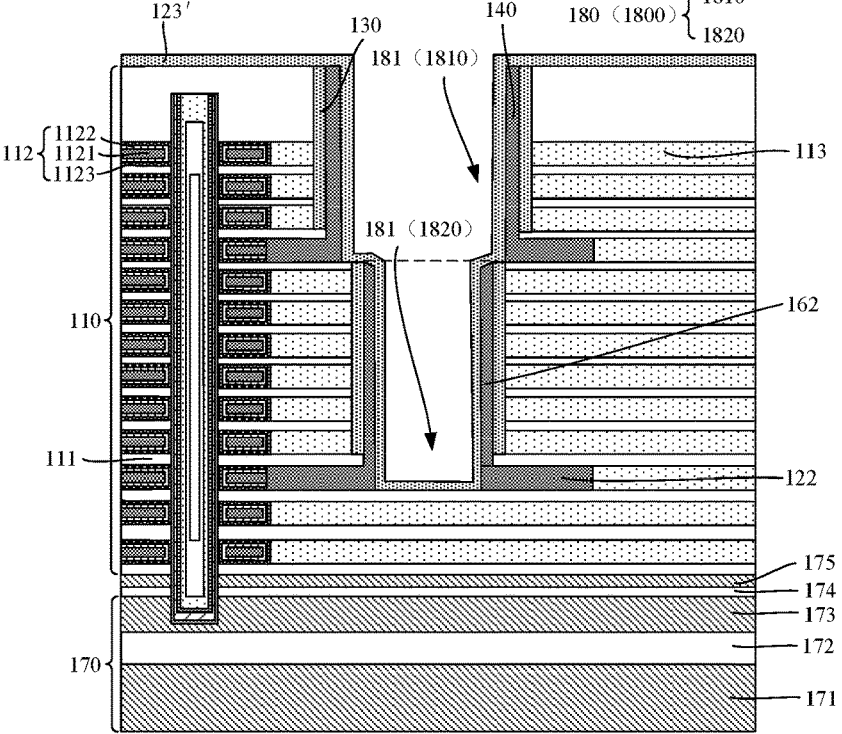

S331: referring to FIG. 14, a second insulating film 123' is formed.

In the above, the second insulating film 123' covers the stack structure 110, the side walls and the bottom walls of the first hole segment 181 of the first sub-hole 1810 and the first hole segment 181 of the second sub-hole 1820. The second insulating film 123' may be formed by using any film deposition process of CVD, PVD and ALD.

S332: referring to FIG. 14 and FIG. 15, parts of the second insulating film 123' that cover the stack structure 110, the bottom walls of the first hole segment 181 of the first sub-hole 1810 and the first hole segment 181 of the second sub-hole 1820 are removed.

In the above, as shown in FIG. 14 and FIG. 15, the bottom of the first sub-hole 1810 exposes the third insulating layer 124 in the second sub-hole 1820 and the top of the first portion 162 of the connecting pillar 160, the bottom of the second sub-hole 1820 exposes the first dielectric layer 111.

Referring to FIG. 14 and FIG. 15, part of the second insulating film 123' remaining in the first hole segment 181 of the first sub-hole 1810 forms the second insulating layer 123. Part of the second insulating film 123' remaining in the first hole segment 181 of the second sub-hole 1820 forms the third insulating layer 124.

The second insulating film 123' may be etched by a dry/wet etching process. For example, the second insulating film 123' is anisotropically etched by using a dry etching process, so as to form the second insulating layer 123 and the third insulating layer 124.

Figure 16:
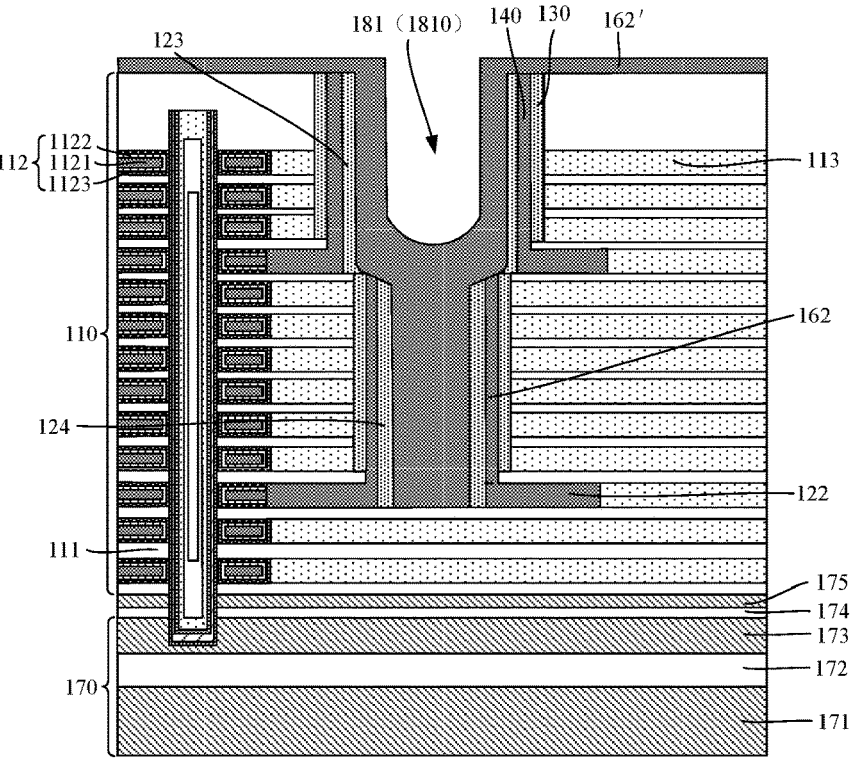

S340: referring to FIG. 15 and FIG. 16, a second conductive film 162' is formed.

In the above, the second conductive film 162' covers the stack structure 110 and the side wall and the bottom wall of the first hole segment 181 of the first sub-hole 1810, and fills the first hole segment 181 of the second sub-hole 1820. The second conductive film 162' may be formed by using any film deposition process of CVD, PVD and ALD.

The material of the second conductive film 162' may include a conductive material, for example, at least one of tungsten, cobalt, copper, aluminum, doped silicon, and silicide.

The materials of the first conductive film 161' and the second conductive film 162' may be different, may also be the same. Exemplarily, the materials of the first conductive film 161' and the second conductive film 162' are the same. For example, each of the materials of the first conductive film 161' and the second conductive film 162' is tungsten.

Figure 17:
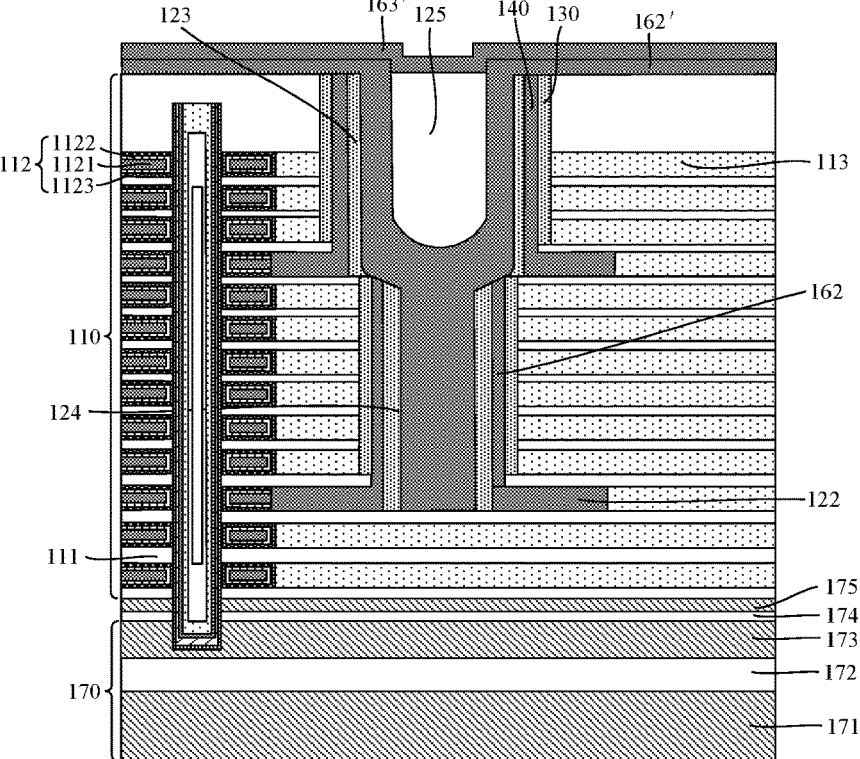

S350: referring to FIG. 15, FIG. 16 and FIG. 17, a filling layer 125 is formed.

In the above, the filling layer 125 is located within the first hole segment 181 of the first sub-hole 1810.

A filling film may be formed by using any film deposition process of CVD, PVD and ALD, the filling film covers the stack structure 110, and is partially located within the first hole segment 181 of the first sub-hole 1810. Then, the filling film may be etched by a dry/wet etching process. For example, the filling film is isotropically etched by using a wet etching process, part of the filling film that covers the stack structure 110 is removed, so that part of the filling film remaining in the first hole segment 181 of the first sub-hole 1810 forms the filling layer 125.

The material of the filling layer 125 may include an insulating material, including at least one of silicon oxide, silicon nitride, silicon oxynitride, doped silicon oxide, organosilicate glass, dielectric metal oxide (e.g., aluminum oxide, hafnium dioxide and the like) and silicate thereof, and organic insulating material.

The materials of the first dielectric layer 111, the first insulating layer 130, the second insulating layer 123, the third insulating layer 124 and the filling layer 125 may be different, may also be the same. Exemplarily, the materials of the first dielectric layer 111, the first insulating layer 130, the second insulating layer 123, the third insulating layer 124 and the filling layer 125 are the same. For example, each of the materials of the first dielectric layer 111, the first insulating layer 130, the second insulating layer 123, the third insulating layer 124 and the filling layer 125 is silicon dioxide.

S360: referring to FIG. 16 and FIG. 17, a third conductive film 163' is formed.

In the above, the third conductive film 163' covers the stack structure 110 and fills the first hole segment 181 of the first sub-hole 1810. The third conductive film 163' may be formed by using any film deposition process of CVD, PVD and ALD.

The material of the third conductive film 163' may include a conductive material, for example, at least one of tungsten, cobalt, copper, aluminum, doped silicon, and silicide.

The materials of the first conductive film 161', the second conductive film 162' and the third conductive film 163' may be different, may also be the same. Exemplarily, the materials of the first conductive film 161', the second conductive film 162' and the third conductive film 163' are the same. For example, the materials of the first conductive film 161', the second conductive film 162' and the third conductive film 163' are tungsten.

S370: referring to FIG. 6, FIG. 15 and FIG. 17, parts of the second conductive film 162' and the third conductive film 163' that are located on the stack structure 110 are removed.

In the above, part of the second conductive film 162' remaining in the first hole segment 181 of the first sub-hole 1810 forms a second portion 163 of the connecting pillar 160. Part of the second conductive film 162' remaining in the first hole segment 181 of the second sub-hole 1820 forms a filling pillar 161. Part of the third conductive film remaining in the first hole segment 181 of the first sub-hole 1810 forms a third portion 164 of the connecting pillar 160.

It should be noted that, when the third portion 164 of the connecting pillar 160 includes a second lap joint portion 1240 and a blocking portion 1640, part of the third conductive film 163' remaining in the first hole segment 181 of the first sub-hole 1810 forms the blocking portion 1640 of the connecting pillar 160, a forming process of the second lap joint portion 1240 is specifically referred to the following description, and thus details will not be repeated here in the present disclosure.

Parts of the second conductive film 162' and the third conductive film 163' that are located on the stack structure 110 may be removed by a planarization process. For example, parts of the second conductive film 162' and the third conductive film 163' that are located on the stack structure 110 are removed by using a chemical mechanical polishing process.

Figure 34:
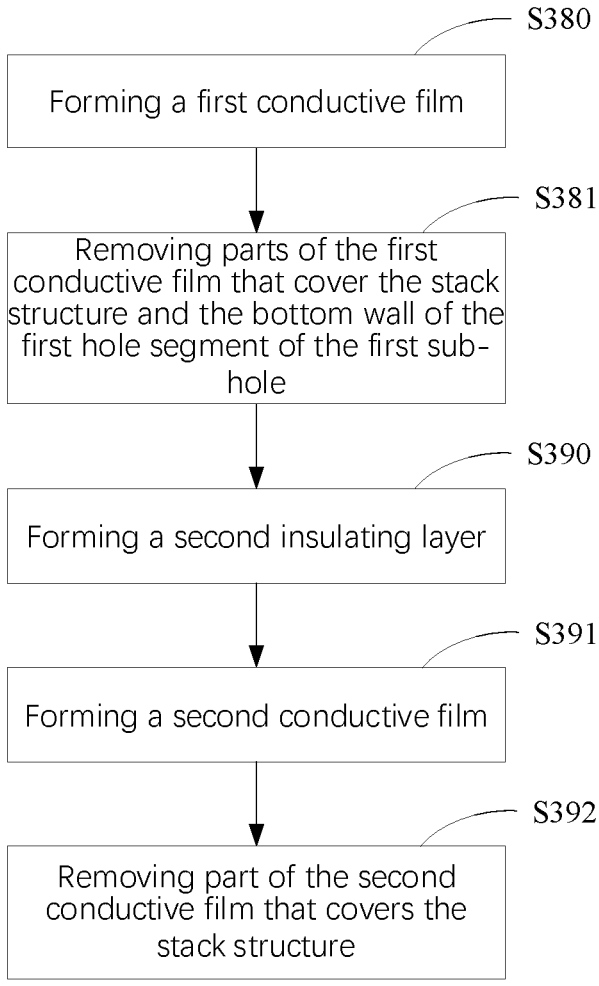

In some other examples, as shown in FIG. 34, S300 includes S380-S390.

There may be at least one gate layer 112 between the second hole segment 182 of the first sub-hole 1810 and the second hole segment 182 of the second sub-hole 1820, there may also be no gate layer 112 between the second hole segment 182 of the first sub-hole 1810 and the second hole segment 182 of the second sub-hole 1820.

In FIG. 7 and FIG. 20 to FIG. 24, it is exemplarily described that S300 includes S380-S390 in the examples of the present disclosure by taking it as an example that there is no gate layer between the second hole segment of the first sub-hole and the second hole segment of the second sub-hole.

Figure 20:
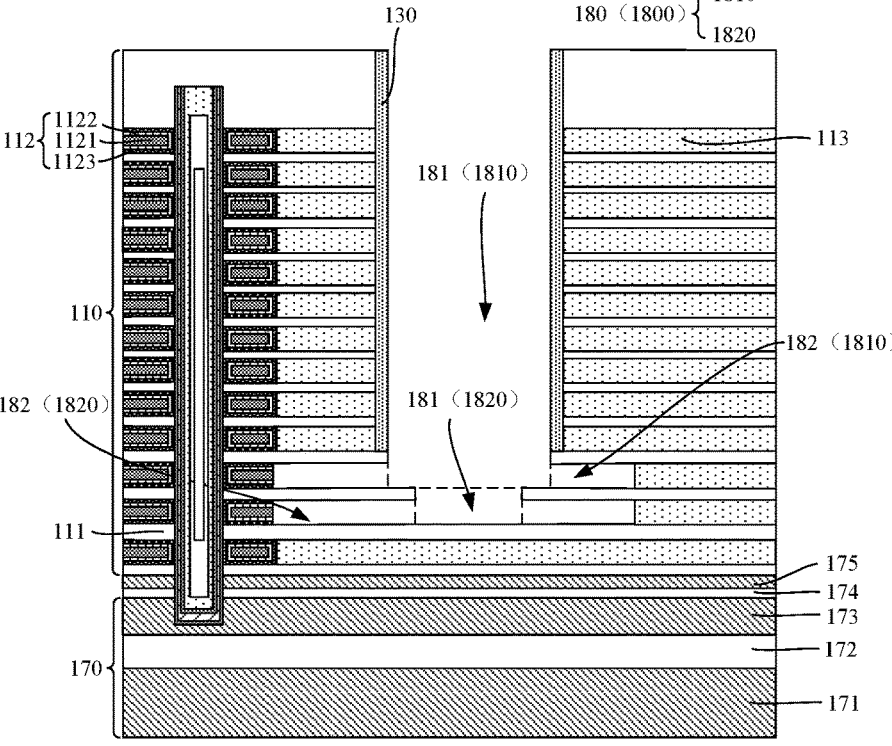
Figure 21:
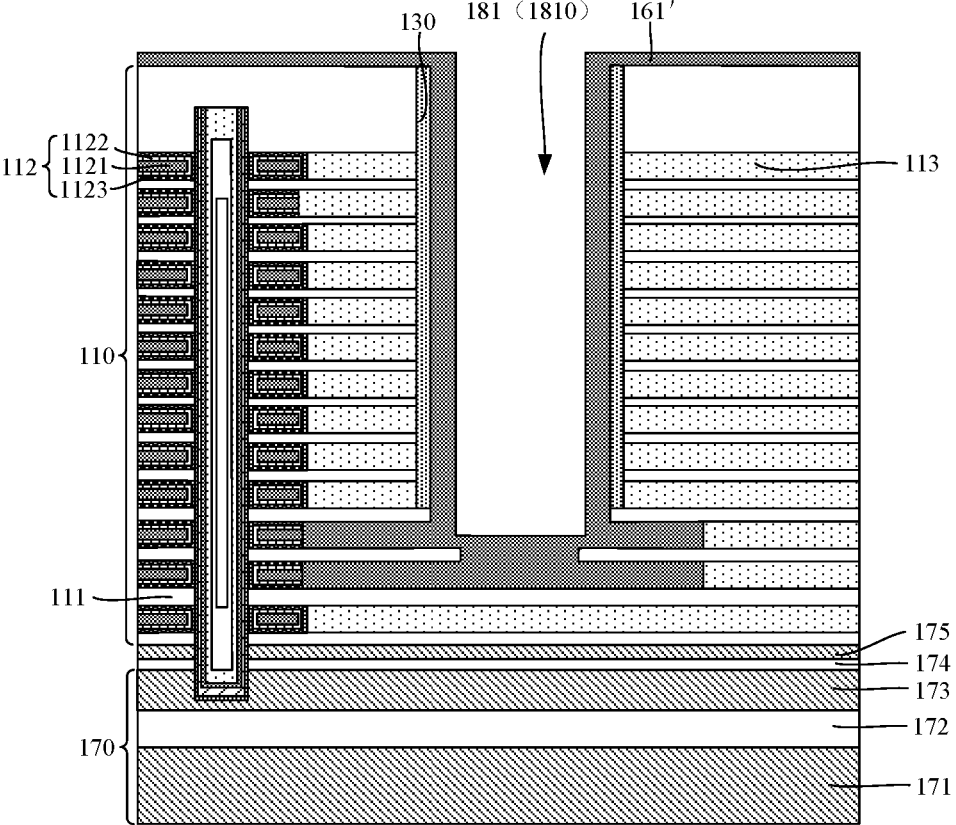

S380: referring to FIG. 20 and FIG. 21, a first conductive film 161' is formed.

In the above, the first conductive film 161' covers the stack structure 110 and the side wall and bottom wall of the first hole segment 181 of the first sub-hole 1810, and fills the second hole segment 182 of the first sub-hole 1810 and the second sub-hole 1820. The first conductive film 161' may be formed by any film deposition process of CVD, PVD and ALD.

It should be noted that, the material of the first conductive film 161' may be referred to the above description, and thus details will not be repeated here in the examples of the present disclosure.

Figure 22:
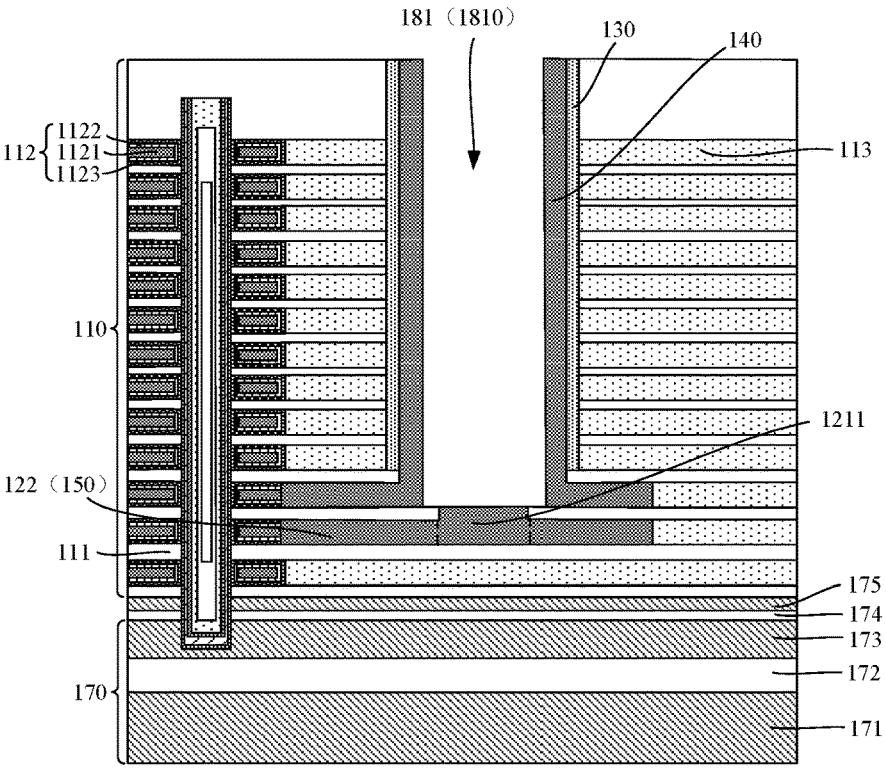

S381: referring to FIG. 20, FIG. 21 and FIG. 22, parts of the first conductive film 161' that cover the stack structure 110 and the bottom wall of the first hole segment 181 of the first sub-hole 1810 are removed.

In the above, part of the first conductive film 161' remaining in the first sub-hole 1810 forms the first conductive portion 140. Part of the first conductive film 161' remaining in the first hole segment 181 of the second sub-hole 1820 forms a first sub-pillar 1211, part of the first conductive film 161' remaining in the second hole segment 182 of the second sub-hole 1820 forms a second conductive sub-portion 122 of the second conductive portion 150.

Figure 23:
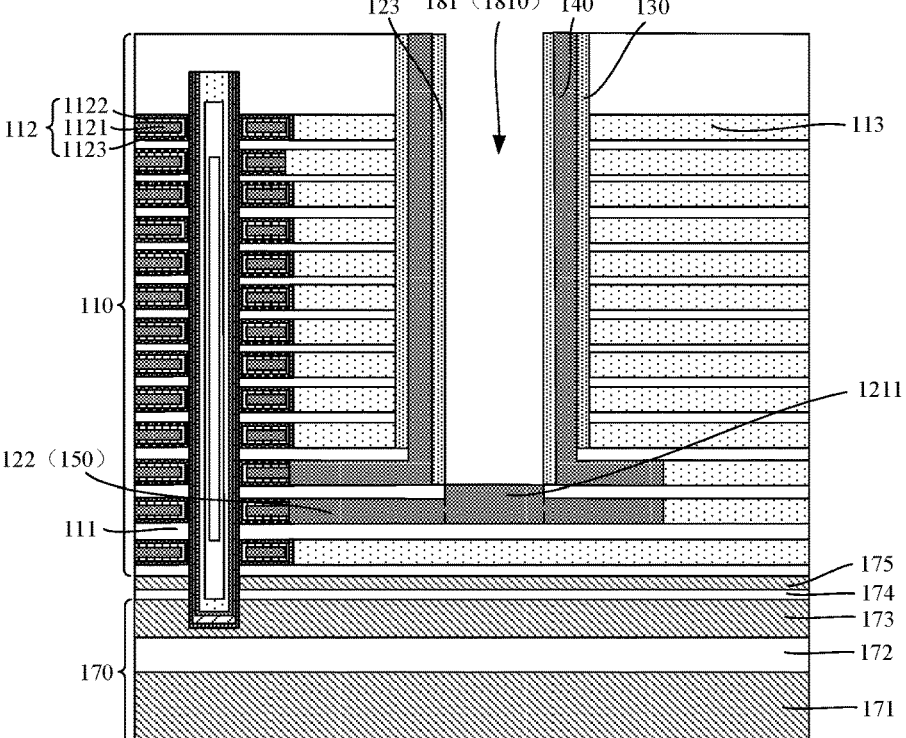

S390: referring to FIG. 22 and FIG. 23, a second insulating layer 123 is formed.

In the above, the second insulating layer 123 covers the side wall of the first hole segment 181 of the first sub-hole 1810, and exposes the first sub-pillar 1211.

The second insulating film may be formed by using any film deposition process of CVD, PVD and ALD, the second insulating film covers the stack structure 110 and the side wall and the bottom wall of the first hole segment 181 of the first sub-hole 1810. Then, the second insulating film may be etched by a dry/wet etching process. For example, the second insulating film is isotropically etched by using a wet etching process, parts of the second insulating film that cover the stack structure 110 and the bottom wall of the first hole segment 181 of the first sub-hole 1810 are removed, so that part of the second insulating film remaining on the side wall of the first hole segment 181 of the first sub-hole 1810 forms the second insulating layer 123.

It should be noted that, the material of the second insulating layer 123 may be referred to the above description, and thus details will not be repeated here in the examples of the present disclosure.

Figure 24:
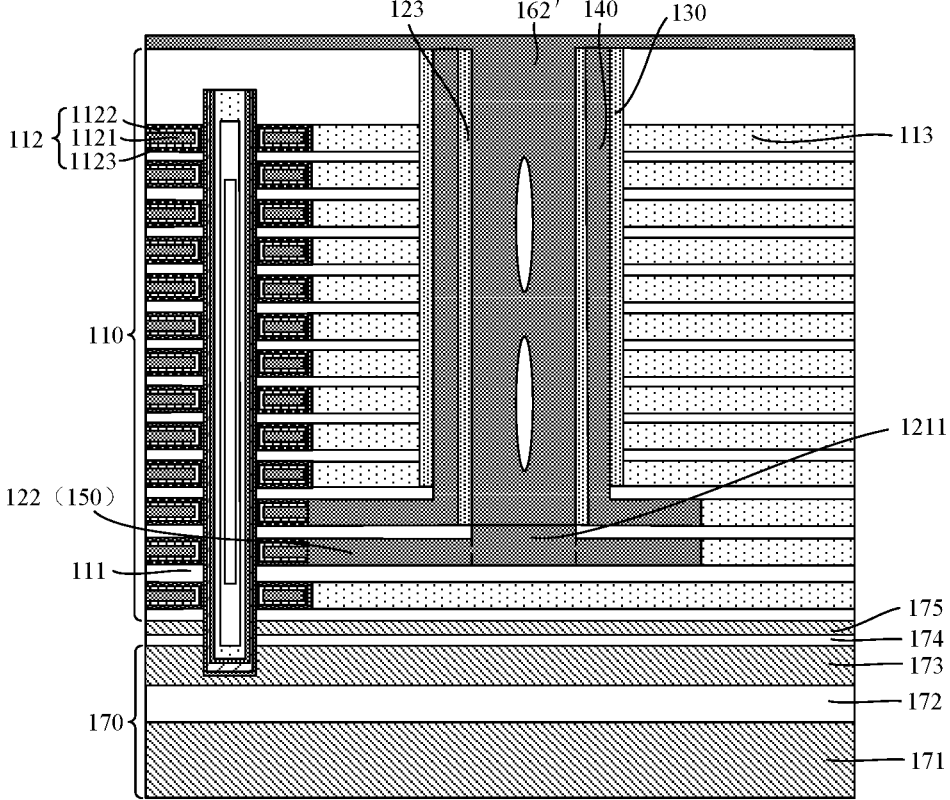

S391: referring to FIG. 23 and FIG. 24, a second conductive film 162' is formed.

In the above, the second conductive film 162' covers the stack structure 110 and fills the first sub-hole 1810. The second conductive film 162' may be formed by using any film deposition process of CVD, PVD and ALD.

It should be noted that, the material of the second conductive film 162' may be referred to the above description, and thus details will not be repeated here in the examples of the present disclosure.

S392: referring to FIG. 7, FIG. 23 and FIG. 24, part of the second conductive film 162' that covers the stack structure 110 is removed.

In the above, part of the second conductive film 162' remaining in the first sub-hole 1810 forms a second sub-pillar 1212.

It should be noted that, when the second sub-pillar 1212 includes a second lap joint portion 1240 and a supporting portion 1213, part of the second conductive film 162' remaining in the first sub-hole 1810 forms the supporting portion 1213 of the second sub-pillar 1212, a forming process of the second lap joint portion 1240 is specifically referred to the following description, and thus details will not be repeated here in the present disclosure.

Part of the second conductive film 162' that covers the stack structure 110 may be removed by a planarization process. For example, part of the second conductive film 162' that covers the stack structure 110 is removed by using a chemical mechanical polishing process.

Figure 35:
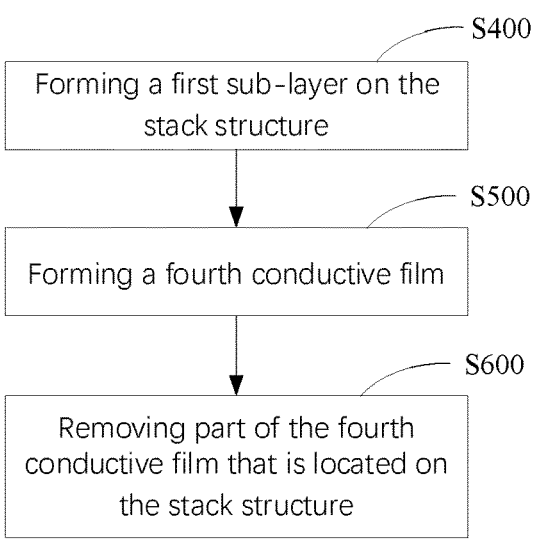

In some examples, referring to FIG. 35, the fabrication method of the semiconductor structure further includes S400-S600.

Figure 25:
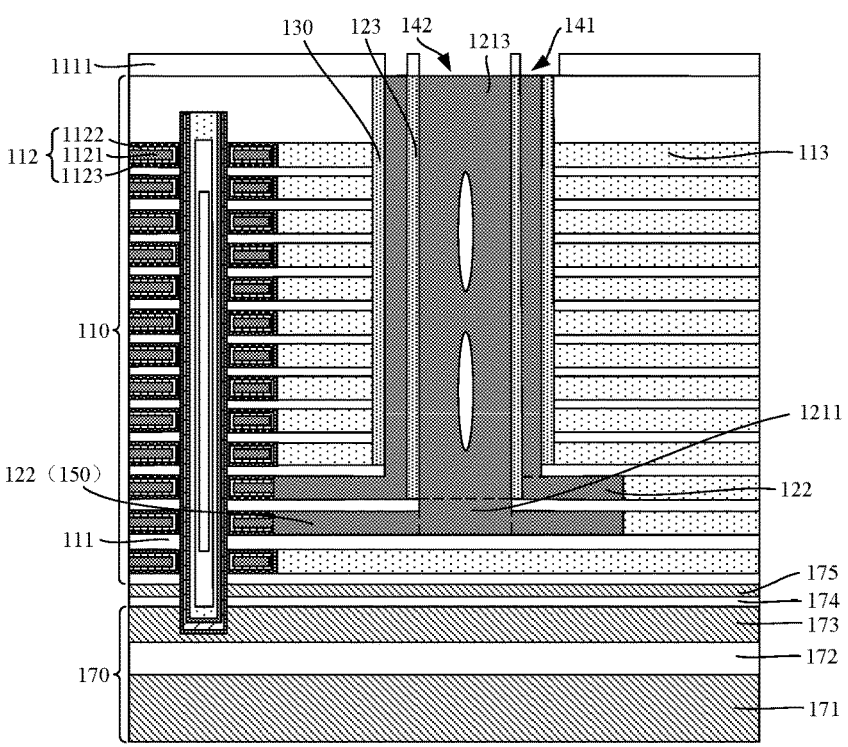

S400: referring to FIG. 25, a first covering layer 1111 is formed on the stack structure 110.

In the above, referring to FIG. 7 and FIG. 25, the first covering layer 1111 is provided with a first lap joint hole 141 and a second lap joint hole 142, the first lap joint hole 141 does not communicate with the second lap joint hole 142. The first lap joint hole 141 at least exposes part of the first sub-portion 1210 of the first conductive portion 140, the second lap joint hole 142 at least exposes the supporting portion 1213 of the second conductive portion 150.

The material of the first covering layer 1111 includes an insulating material, including at least one of silicon oxide, silicon nitride, silicon oxynitride, doped silicon oxide, organosilicate glass, dielectric metal oxide (e.g., aluminum oxide, hafnium dioxide and the like) and silicate thereof, and organic insulating material.

The materials of the first covering layer 1111 and the first dielectric layer 111 may be different, may also be the same. Exemplarily, the materials of the first covering layer 1111 and the first dielectric layer 111 are the same. For example, each of the materials of the first covering layer 1111 and the first dielectric layer 111 is silicon dioxide.

Figure 26:
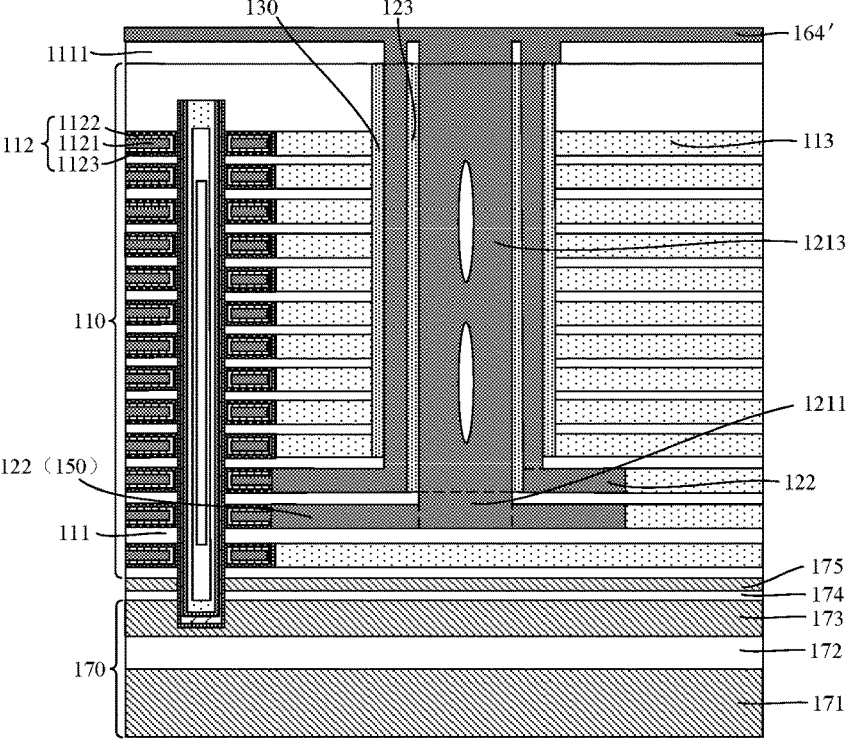

S500: referring to FIG. 26, a fourth conductive film 164' is formed.

In the above, the fourth conductive film 164' is located on the stack structure 110, and fills the first lap joint hole 141 and the second lap joint hole 142. The fourth conductive film 164' may be formed by using any film deposition process of CVD, PVD and ALD.

The material of the fourth conductive film 164' may include a conductive material, for example, at least one of tungsten, cobalt, copper, aluminum, doped silicon, and silicide.

The materials of the first conductive film 161', the second conductive film 162' and the fourth conductive film 164' may be different, may also be the same. Exemplarily, the materials of the first conductive film 161', the second conductive film 162' and the fourth conductive film 164' are the same. For example, the materials of the first conductive film 161', the second conductive film 162' and the fourth conductive film 164' are tungsten.

S600: referring to FIG. 7, FIG. 25 and FIG. 26, part of the fourth conductive film 164' that is located on the stack structure 110 is removed.

In the above, part of the fourth conductive film 164' remaining in the first lap joint hole 141 forms a first lap joint portion 1220, part of the fourth conductive film 164' remaining in the second lap joint hole 142 forms a second lap joint portion 1240.

Part of the fourth conductive film 164' that is located on the stack structure 110 may be removed by a planarization process. For example, part of the fourth conductive film 164' that is located on the stack structure 110 is removed by using a chemical mechanical polishing process.

Figure 4A:
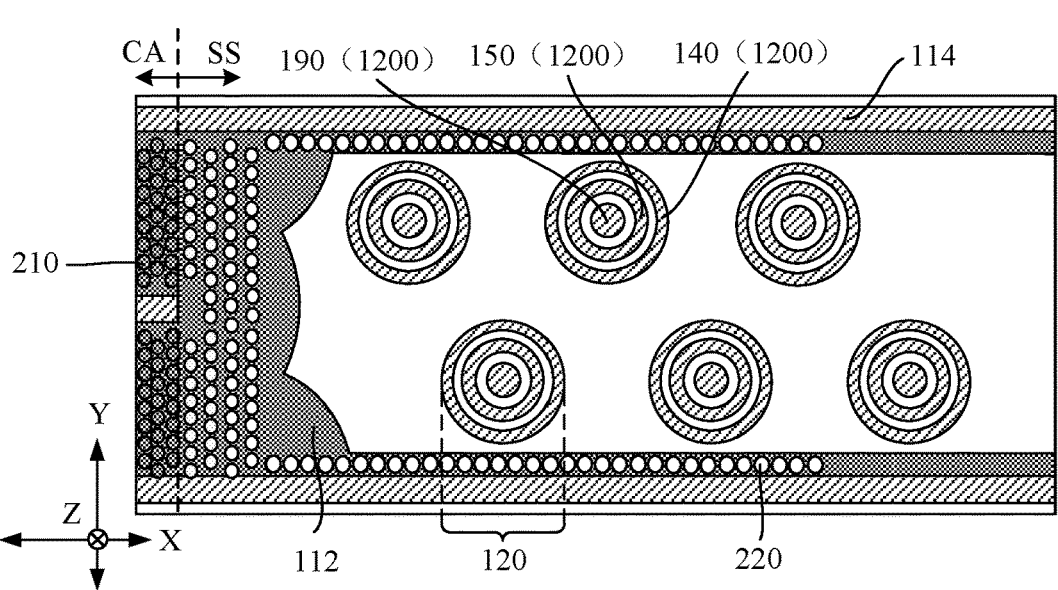
FIG. 4A is a top view of a semiconductor structure according to some examples.
Figure 4B:
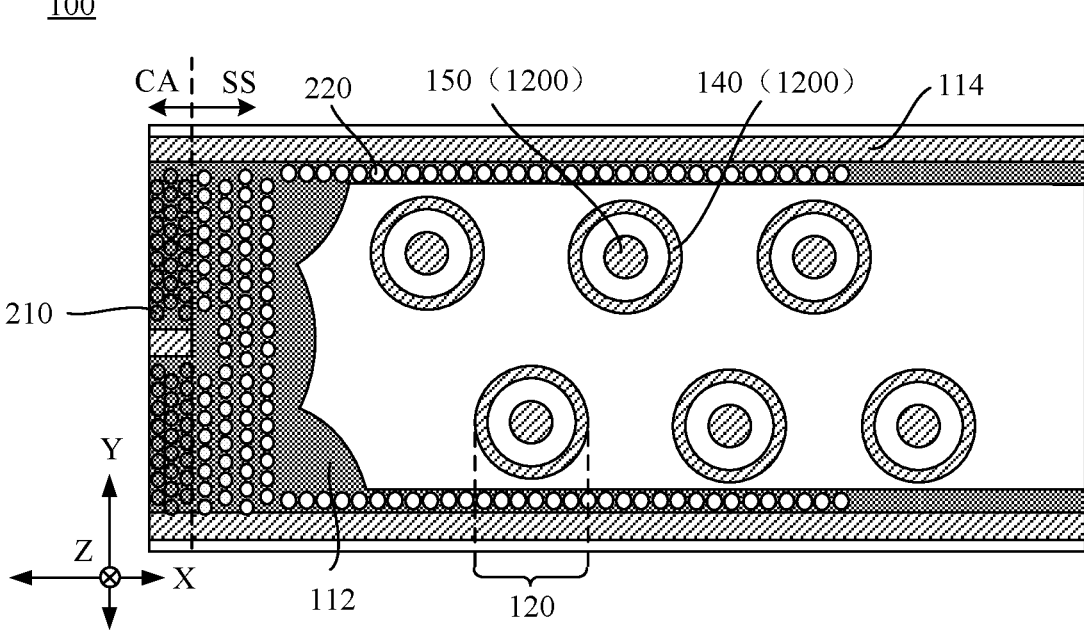
FIG. 4B is a top view of another semiconductor structure according to some examples.

A semiconductor structure 100 provided in some examples of the present disclosure, referring to FIG. 4B, FIG. 5 and FIG. 6, includes a stack structure 110 and a plurality of conductive structures 120.

As shown in FIG. 5 and FIG. 6, the stack structure 110 includes a plurality of first dielectric layers 111 and gate layers 112 which are alternately disposed. The stack structure 110 has a memory region CA and a connection region SS, the stack structure 110 in the connection region SS further includes a plurality of first dielectric layers 111 and second dielectric layers 113 which are alternately disposed.

That is, the gate layer 112 and the second dielectric layer 113 are disposed on the same layer, and the gate layer 112 is at least located in the memory region CA, for example, the gate layer 112 partially extends from the memory region CA to the connection region SS. The second dielectric layer 113 is located in the connection region SS.

It should be noted that, the material of the first dielectric layer 111, the material of the gate layer 112 and the material of the second dielectric layer 113 may refer to the above description, and thus details will not be repeated here in the examples of the present disclosure.

As shown in FIG. 4B and FIG. 5, the conductive structure 120 is disposed in the connection region SS. The conductive structure 120 includes a plurality of conductive portions 1200 insulated from each other. In conjuction with FIG. 6, the conductive portions 1200 penetrate through part of the stack structure 110 and are connected with the gate layers 112.

Parts of the plurality of conductive portions 1200 that penetrate through the stack structure 1100 are sequentially disposed in a nested manner, and the gate layers 112 connected with the plurality of conductive portions 1200 are located on different layers.

In this case, the plurality of conductive portions 1200 of each conductive structure 120 are disposed in a centralized manner, and may be in electrical contact with the plurality of gate layers 112 respectively, so that the gate layers 112 are led out and are electrically connected with corresponding word line connecting lines. That is, the plurality of conductive portions 1200 corresponding to the plurality of gate layers 112 may be disposed in an integrated manner to form a conductive structure 120, so that the area occupied by the plurality of conductive portions 1200 in the conductive structure 120 is reduced, thereby reducing the total area occupied by all conductive portions 1200, reducing the area of the connection region SS, and improving the memory density.

Exemplarily, referring to FIG. 5 and FIG. 6, each conductive portion 1200 includes a first conductive sub-portion 121 and a second conductive sub-portion 122.

The first conductive sub-portion 121 extends in a stacking direction of the stack structure 110 and penetrates through part of the stack structure 110, and the first conductive sub-portions 121 of the plurality of conductive portions 1200 are sequentially disposed in a nested manner. The second conductive sub-portion 122 extends in a horizontal direction (a X-Y plane in FIG. 1), is disposed on the same layer as the gate layer 112 correspondingly connected with the conductive portion 1200, and is connected with the gate layer 112 and the first conductive sub-portion 121.

It should be noted that, referring to FIG. 1, FIG. 6 and FIG. 7, in an orthographic projection of a film layer where the gate layer 112 connected with the conductive portion 1200 is located on a reference plane, the part overlapping with the orthographic projection of the second dielectric layer 113 adjacent to the upper side of the film layer on the reference plane is the second conductive sub-portion 122 of the conductive portion 1200, the non-overlapping part is the gate layer 112.

At this time, the first conductive sub-portions 121 of the plurality of conductive portions 1200 are sequentially disposed in a nested manner, and compared with the conductive portion 1200 far away from the memory region CA, the inner side region of the conductive portion 1200 that is closer to the memory region CA is used, so that the area occupied by the plurality of conductive portions 1200 in the conductive structure 120 is reduced, the total area occupied by all conductive portions 1200 is reduced, the area of the connection region SS is reduced, and the memory density is improved.

In some examples, as shown in FIG. 6 and FIG. 7, the semiconductor structure 100 further includes a first insulating layer 130, which is disposed between the conductive structure 120 and the stack structure 110, so as to prevent other second dielectric layers 113 besides the corresponding second dielectric layer 113 from being etched away during the process of forming the conductive portion 1200.

In some examples, as shown in FIG. 5, FIG. 6 and FIG. 7, the plurality of conductive portions 1200 in the conductive structure 120 are located on the upper sides of the gate layers 112 connected with the conductive portions 1200 that are farther away from the memory region CA compared with the gate layers 112 connected with the conductive portions 1200 that are closer to the memory region CA.

By arranging in this way, when the first conductive sub-portion 121 of any conductive portion 1200 is connected with the gate layer 112, for example, by the second conductive sub-portion 122, the second conductive sub-portion 122 does not intersect with the first conductive sub-portions 121 of the other conductive portions 1200, that is, when the conductive portion 1200 is connected with the gate layer 112, there is no need to consider an avoidance or insulation design between different conductive portions 1200, thereby reducing the structural complexity, and simplifying the process flows.

Exemplarily, as shown in FIG. 5, FIG. 6 and FIG. 7, the plurality of conductive portions 1200 include first conductive portions 140 and second conductive portions 150, the first conductive sub-portions 121 of the first conductive portions 140 surround the first conductive sub-portions 121 of the second conductive portions 150.

At this time, the first conductive portion 140 is the conductive portion 1200 that is closer to the memory region CA, the second conductive portion 150 is the conductive portion 1200 that is farther away from the memory region CA, wherein the gate layer 112 connected with the first conductive portion 140 is located above the gate layer 112 connected with the second conductive portion 150.

In some examples, as shown in FIG. 5 and FIG. 6, among the plurality of conductive portions 1200 in the conductive structure 120, the first conductive sub-portion 121 of the conductive portion 1200 that is closest to the memory region CA includes a first sub-portion 1210 and a first lap joint portion 1220 on the first sub-portion 1210.

The first lap joint portion 1220 includes a first lap joint sub-portion 1221 and a second lap joint sub-portion 1222 connected with each other, the first lap joint sub-portion 1221 is connected with the first sub-portion 1210, the second lap joint sub-portion 1222 is located on a side of the first sub-portion 1210 that is close to the stack structure 110.

For example, as shown in FIG. 5 and FIG. 6, the orthographic projection of the first lap joint sub-portion 1221 on a reference plane may, for example, overlap with the orthographic projection of the first sub-portion 1210 on the reference plane. The second lap joint sub-portion 1222 is disposed on the outer side of the first lap joint sub-portion 1221.

By arranging in this way, the second lap joint sub-portion 1222 may be disposed in a region between different conductive structures 120. In this way, the minimum size of the second lap joint sub-portion 1222 may be, for example, greater than the minimum size of the first lap joint sub-portion 1221, so that the corresponding drain terminal selection gate contact SGD-CNT (see FIG. 1) is in aligned lap joint with the second lap joint sub-portion 1222, thereby reducing the process difficulty.

On this basis, referring to FIG. 5 and FIG. 6, the semiconductor structure 100 includes a first covering layer 1111 on the upper side of the stack structure 110.

The first lap joint portion 1220 penetrates through the first covering layer 1111, the first sub-portion 1210 penetrates through part of the stack structure 110, so as to facilitate the formation of the first lap joint portion 1220, the specific process procedure may be referred to the following description, and thus details will not be repeated here in the examples of the present disclosure.

It can be understood that, as shown in FIG. 5 and FIG. 6, among the plurality of conductive portions 1200 in the conductive structure 120, except for the conductive portion 1200 that is closest to the memory region CA, the remaining conductive portions 1200 include second sub-portions 1230 and second lap joint portions 1240 located on the second sub-portions 1230, so that the remaining conductive portions 1200 can expose the upper surface of the stack structure 110.

For example, as shown in FIG. 5 and FIG. 6, the orthographic projection of the second lap joint portion 1240 on the reference plane may, for example, overlap with the orthographic projection of the second sub-portion 1230 on the reference plane.

The second lap joint portion 1240 penetrates through the first covering layer 1111, the second sub-portion 1230 penetrates through part of the stack structure 110. Here, the second lap joint portion 1240 may be formed in the same process procedure as the first lap joint portion 1220, the specific process procedure may be referred to the following description, and thus details will not be repeated here in the examples of the present disclosure.

Exemplarily, as shown in FIG. 5, FIG. 6 and FIG. 7, the plurality of conductive portions 1200 include first conductive portions 140 and second conductive portions 150, the first conductive sub-portions 121 of the first conductive portions 140 surround the first conductive sub-portions 121 of the second conductive portions 150.

At this time, the first conductive portion 140 is the conductive portion 1200 that is closest to the memory region CA. The first conductive sub-portion 121 of the first conductive portion 140 includes a first sub-portion 1210 and a first lap joint portion 1220 on the first sub-portion 1210. The first conductive sub-portion 121 of the second conductive portion 150 includes a second sub-portion 1230 and a second lap joint portion 1240 on the second sub-portion 1230.

In some examples, referring to FIG. 4B and FIG. 6, among the plurality of conductive portions 1200 in the conductive structure 120, the orthographic projection of the first conductive sub-portion 121 of the conductive portion 1200 that is farthest away from the memory region CA on a reference plane is annular or circular. For example, the orthographic projection of the first conductive sub-portion 121 of the conductive portion 1200 that is farthest away from the stack structure 110 on a reference plane is circular, so as to increase the area of the upper surface of the first conductive sub-portion 121, and to reduce the process difficulty of aligned lap joint with the first conductive sub-portion 121. The orthographic projections of the remaining conductive portions 1200 on a reference plane are annular.

Exemplarily, as shown in FIG. 4B and FIG. 6, the plurality of conductive portions 1200 include first conductive portions 140 and second conductive portions 150, the first conductive sub-portions 121 of the first conductive portions 140 surround the first conductive sub-portions 121 of the second conductive portions 150.

At this time, the second conductive portion 150 is the conductive portion 1200 that is farthest away from the memory region CA. The orthographic projection of the first conductive sub-portion 121 of the first conductive portion 140 on a reference plane is annular, the orthographic projection of the first conductive sub-portion 121 of the second conductive portion 150 on a reference plane is circular.

It should be noted that, referring to FIG. 5 and FIG. 6, when the first conductive portion 140 includes the first lap joint portion 1220 and the first sub-portion 1210, the orthographic projection of the first sub-portion 1210 of the first conductive portion 140 on a reference plane may be, for example, annular, the orthographic projection of the first lap joint sub-portion 1221 of the first lap joint portion 1220 on a reference plane may be, for example, annular, the orthographic projection of the second lap joint sub-portion 1222 of the first lap joint portion 1220 on a reference plane may be, be example, circular.

On this basis, referring to FIG. 4B and FIG. 6, the first conductive sub-portions 121 of the plurality of conductive portions 1200 may be, for example, arranged coaxially, so that the distance between the first conductive sub-portions 121 of any two adjacent conductive portions 1200 is not too small, thereby reducing the process difficulty of aligned lap joint with the conductive portion 1200.

In some examples, as shown in FIG. 6 and FIG. 7, the conductive structure 120 further includes a second insulating layer 123, which is disposed between the first conductive sub-portions 121 of any two adjacent conductive portions 1200, so that the first conductive sub-portions 121 of the two adjacent conductive portions 1200 are insulated from each other.

In some examples, as shown in FIG. 5, FIG. 6 and FIG. 7, each conductive structure 120 includes a first conductive portion 140 and a second conductive portion 150, the first conductive sub-portion 121 of the first conductive portion 140 surrounds the first conductive sub-portion 121 of the second conductive portion 150.

In some other examples, referring to FIG. 4A, each conductive structure 120 includes a first conductive portion 140, a second conductive portion 150 and a third conductive portion 190, part of the first conductive portion 140 that penetrates through the stack structure 110 (see FIG. 6) surrounds part of the second conductive portion 150 that penetrates through the stack structure 110 (see FIG. 6), part of the second conductive portion 150 that penetrates through the stack structure 110 (see FIG. 6) surrounds part of the third conductive portion 190 that penetrates through the stack structure 110 (see FIG. 6).

By taking it as an example that each conductive structure 120 includes a first conductive portion 140 and a second conductive portion 150, the examples of the present disclosure are exemplarily described below.

In some examples, as shown in FIG. 7, the first conductive sub-portion 121 of the second conductive portion 150 includes a first sub-pillar 1211 and a second sub-pillar 1212.

Here, there may be at least one gate layer 112 between the gate layer 112 connected with the first conductive portion 140 and the gate layer 112 connected with the second conductive portion 150; there may also be no gate layer 112 between the gate layer 112 connected with the first conductive portion 140 and the gate layer 112 connected with the second conductive portion 150. By taking it as an example in FIG. 7 that there is no gate layer between the gate layer connected with the first conductive portion and the gate layer connected with the second conductive portion, the examples of the present disclosure are exemplarily described.

Referring to FIG. 7, the first sub-pillar 1211 penetrates through a film layer between the gate layer 112 connected with the first conductive portion 140 and the gate layer 112 connected with the second conductive portion 150. The second sub-pillar 1212 extends from the upper surface of the stack structure 110 to the first sub-pillar 1211, and is electrically connected with the first sub-pillar 1211.

Referring to FIG. 7, when the first conductive sub-portion 121 includes a second lap joint portion 1240, the second sub-pillar 1212 includes a second lap joint portion 1240 and a supporting portion 1213, the second lap joint portion 1240 is located above the supporting portion 1213, the supporting portion 1213 is connected with the first sub-pillar 1211.

At this time, the first sub-pillar 1211 and the supporting portion 1213 constitute the second sub-portion 1230 mentioned above.

Here, the first insulating layer 130 is located between the first conductive sub-portion 121 of the first conductive portion 140 and the stack structure 110. The second insulating layer 123 is located between the first conductive sub-portion 121 of the first conductive portion 140 and the first conductive sub-portion 121 of the second conductive portion 150.

In some other examples, as shown in FIG. 6, the first conductive sub-portion 121 of the second conductive portion 150 includes a connecting pillar 160 and a filling pillar 161.

Here, there may be at least one gate layer 112 between the gate layer 112 connected with the first conductive portion 140 and the gate layer 112 connected with the second conductive portion 150; there may also be no gate layer 112 between the gate layer 112 connected with the first conductive portion 140 and the gate layer 112 connected with the second conductive portion 150. By taking it as an example in FIG. 6 that there is at least one gate layer between the gate layer connected with the first conductive portion and the gate layer connected with the second conductive portion, the examples of the present disclosure are exemplarily described.

The connecting pillar 160 penetrates through part of the stack structure 110, and is connected with the second conductive sub-portion 122; the connecting pillar 160 forms a cylindrical structure with a first opening OP on a single side in a surrounding manner, and the first opening faces the lower side of the stack structure 110. The filling pillar 161 is located within the cylindrical structure which is formed by the connecting pillar 160 in a surrounding manner. The filling pillar 161 includes a pillar body 1611 and a fixing portion 1612, the pillar body 1611 and the connecting pillar 160 are spaced apart from each other, the fixing portion 1612 is located at the upper end of the pillar body 1611, and the fixing portion 1612 is connected with the pillar body 1611 and the connecting pillar 160.

Exemplarily, as shown in FIG. 6, the connecting pillar 160 includes a first portion 162, a second portion 163 and a third portion 164.

As shown in FIG. 6, the first portion 162 penetrates through the first dielectric layer 111 and the second dielectric layer 113 between the gate layer 112 connected with the first conductive portion 140 and the gate layer 112 connected with the second conductive portion 150. The first portion 162 forms a cylindrical structure in a surrounding manner, the pillar body 1611 is located within the cylindrical structure which is formed by the first portion 162 in a surrounding manner.

As shown in FIG. 6, the second portion 163 is integrally formed with the filling pillar 161, the second portion 163 extends from the upper surface of the stack structure 110 to the upper end of the first portion 162, and the second portion 163 forms a cylindrical structure in a surrounding manner. Here, the second portion 163 being integrally formed with the filling pillar 161 means that the second portion 163 and the filling pillar 161 may be synchronously formed in the same process step.

As shown in FIG. 6, the third portion 164 blocks the opening on the upper side of the cylindrical structure which is formed by the second portion 163 in a surrounding manner, so as to increase the area of the connecting pillar 160 that is exposed to the upper surface of the stack structure 110, and to reduce the process difficulty of aligned lap joint with the first conductive sub-portion 121 of the second conductive portion 150.

Referring to FIG. 6, when the first conductive sub-portion 121 includes a second lap joint portion 1240, the third portion 164 includes a second lap joint portion 1240 and a blocking portion 1640. The blocking portion 1640 is located within the cylindrical structure which is formed by the second portion 163 in a surrounding manner, and blocks the cylindrical structure which is formed by the second portion 163 in a surrounding manner. The second lap joint portion 1240 is located above the second portion 163 and the blocking portion 1640.

At this time, the filling pillar 161, the first portion 162, the second portion 163 and the blocking portion 1640 constitute the second sub-portion 1230 mentioned above.

Here, as shown in FIG. 6, the first insulating layer 130 is located between the first conductive sub-portion 121 of the first conductive portion 140 and the stack structure 110, and is located between the first portion 162 of the connecting pillar 160 of the second conductive portion 150 and the stack structure 110. The second insulating layer 123 is located between the first conductive sub-portion 121 of the first conductive portion 140 and the second portion 163 of the second conductive portion 150.

In addition, the second conductive portion 150 may, for example, further include a third insulating layer 124, the third insulating layer 124 is located between the pillar body 1611 and the connecting pillar 160. Here, the third insulating layer 124 and the second insulating layer 123 may be formed synchronously in the same process step.

In some examples, as shown in FIG. 6, the second conductive portion 150 may further include a filling layer 125 between the fixing portion 1612 and the connecting pillar 160. By arranging in this way, the proportion of the conductive material in the second conductive part 150 can be reduced, the load on the substrate for carrying the stack structure 110 in the fabrication process is reduced, the risk of bending deformation of the substrate is reduced, the structural stability of the semiconductor structure 100 is improved.

In some examples, as shown in FIG. 4B and FIG. 5, the semiconductor structure 100 further includes a gate line isolation structure 114, which penetrates through the stack structure 110. Here, the gate line isolation structure 114 may, for example, extend in a second direction X.

It should be noted that, the material of the gate line isolation structure 114 may be referred to the above description, and thus details will not be repeated here in the examples of the present disclosure.

Figure 36:
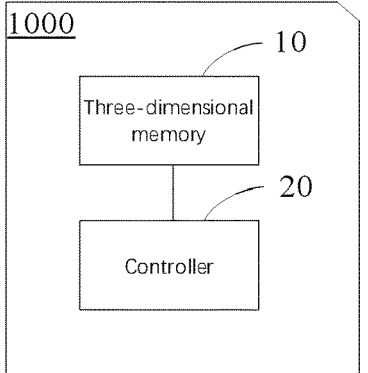
FIG. 36 is a block diagram of a memory system according to some examples.
Figure 37:
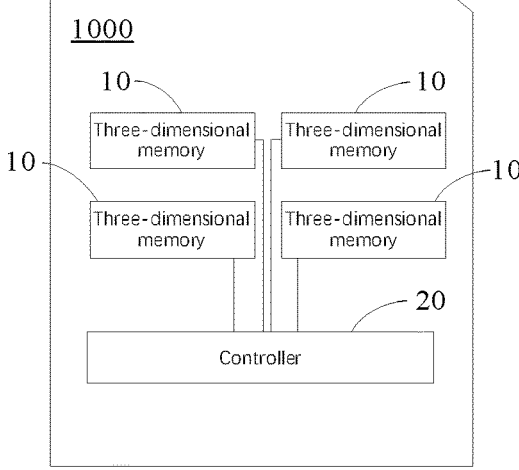
FIG. 37 is a block diagram of a memory system according to some other examples.

FIG. 36 is a block diagram of a memory system according to some examples. FIG. 37 is a block diagram of a memory system according to some other examples.

Referring to FIG. 36 and FIG. 37, some examples of the present disclosure further provide a memory system 1000. The memory system 1000 includes a controller 20, and a three-dimensional memory 10 as described in some examples above, the controller 20 is coupled to the three-dimensional memory 10, so as to control the three-dimensional memory 10 to store data.

The memory system 1000 may be integrated into various types of memory devices, for example, be included in the same package, such as a universal flash storage (UFS) package or an embedded media card (eMMC) package. That is, the memory system 1000 may be applied to and packaged into different types of electronic products, for example, mobile phones (e.g., cellphones), desktop computers, tablet computers, notebook computers, servers, vehicle-mounted devices, game consoles, printers, positioning devices, wearable devices, smart sensors, mobile power supplies, virtual reality (VR) devices, augmented reality (AR) devices, or any other suitable electronic devices having memories therein.

In some examples, referring to FIG. 36, the memory system 1000 includes a controller 20 and a three-dimensional memory 10, the memory system 1000 may be integrated into a three-dimensional memory card.

The three-dimensional memory card includes any one of a PC card (PCMCIA, Personal Computer Three-dimensional Memory Card International Association), a compact flash (CF) card, a smart media (SM) card, a three-dimensional memory, a multimedia card (MMC), a secure digital memory (SD) card, and a UFS.

In some other examples, referring to FIG. 37, the memory system 1000 includes a controller 20 and a plurality of three-dimensional memories 10, the memory system 1000 is integrated into a solid state drive (SSD).

In the memory system 1000, in some examples, the controller 20 is configured to operate in a low duty-cycle environment like SD cards, CF cards, universal serial bus (USB) flash drives, or other media for use in electronic devices, such as personal computers, digital cameras and mobile phones, etc.

In some other examples, the controller 20 is configured to operate in a high duty-cycle environment SSD or eMMC used as data storage of mobile devices, such as smartphones, tablet computers and laptop computers, etc, and enterprise memory arrays.

In some examples, the controller 20 may be configured to manage data stored in the three-dimensional memory 10 and communicate with an external device (e.g., a host). In some examples, the controller 20 may also be configured to control the operations of the three-dimensional memory 10, such as reading, erasing and programming operations. In some examples, the controller 20 may also be configured to manage various functions with respect to the data stored or to be stored in the three-dimensional memory 10, including at least one of bad block management, garbage collection, logical-to-physical address conversion and wear leveling. In some examples, the controller 20 is further configured to process error correction codes with respect to data read from or written into the three-dimensional memory 10.

Of course, the controller 20 may also perform any other suitable functions, for example, formatting the three-dimensional memory 10; for example, the controller 20 may communicate with an external device (e.g., a host) through at least one of various interface protocols.

It should be noted that, the interface protocols include at least one of a USB protocol, an MMC protocol, a peripheral component interconnect (PCI) protocol, a PCI express (PCI-E) protocol, an advanced technology attachment (ATA) protocol, a serial ATA protocol, a parallel ATA protocol, a small computer small interface (SCSI) protocol, an enhanced small disk interface (ESDI) protocol, an integrated drive electronic (IDE) protocol, a Firewire protocol, etc.

Some examples of the present disclosure further provide an electronic device. The electronic device may be any one of a mobile phone, a desktop computer, a tablet computer, a notebook computer, a server, a vehicle-mounted device, a wearable device (e.g., a smart watch, a smart wristband, smart glasses, and the like), a mobile power supply, a gaming machine, a digital multimedia player, etc. The electronic device may include the memory system 1000 described above, and may further include at least one of a central processing unit (CPU) and a cache, etc.

Examples of the present disclosure provide a semiconductor structure and a fabrication method thereof, a three-dimensional memory, and a memory system, so as to reduce the area of a connection region and improve the memory density.

In order to achieve the above objectives, the examples of the present disclosure use the following technical solutions:

In one aspect, a semiconductor structure is provided. The semiconductor structure comprises a stack structure and a plurality of conductive structures. The stack structure has a memory region and a connection region. The stack structure comprises a plurality of first dielectric layers and gate layers which are alternately disposed; the stack structure has the memory region and the connection region, the stack structure in the connection region further comprises a plurality of first dielectric layers and second dielectric layers which are alternately disposed. The plurality of conductive structures are disposed in the connection region. The conductive structure comprises a plurality of conductive portions insulated from each other, each conductive portion penetrates through part of the stack structure and is connected with the gate layers; parts of the plurality of conductive portions that penetrate through the stack structure are sequentially disposed in a nested manner.

In the semiconductor structure provided by the above examples of the present disclosure, the conductive structure comprises the plurality of conductive portions insulated from each other, each conductive portion penetrates through part of the stack structure and is connected with the gate layers, wherein parts of the plurality of conductive portions that penetrate through the stack structure are sequentially disposed in a nested way. In this case, the plurality of conductive portions of each conductive structure are disposed in a centralized manner, and may be in electrical contact with the plurality of gate layers respectively, so that the gate layers are led out and are electrically connected with corresponding word line connecting lines. That is, the plurality of conductive portions corresponding to the plurality of gate layers may be disposed in an integrated manner to form a conductive structure, so that the area occupied by the plurality of conductive portions in the conductive structure is reduced, thereby reducing the total area occupied by all conductive portions, reducing the area of the connection region, and improving the memory density.

In some examples, the conductive portion comprises a first conductive sub-portion and a second conductive sub-portion. The first conductive sub-portion penetrates through part of the stack structure, and the first conductive sub-portions of the plurality of conductive portions are sequentially disposed in a nested manner. The second conductive sub-portion is disposed on the same layer as the gate layer, and the second conductive sub-portion is connected with the gate layer and the first conductive sub-portion.

In some examples, the plurality of conductive portions in the conductive structure are located on upper sides of the gate layers connected with the conductive portions that are farther away from the memory region compared with the gate layers connected with the conductive portions that are closer to the memory region.

In some examples, among the plurality of conductive portions in the conductive structure, the first conductive sub-portion of the conductive portion that is closest to the memory region includes a first sub-portion and a first lap joint portion. The first lap joint portion is connected with the first sub-portion.

In some examples, among the plurality of conductive portions in the conductive structure, an orthographic projection of the first conductive sub-portion of the conductive portion that is farthest away from the memory region on a reference plane is annular or circular; orthographic projections of the first conductive sub-portions of the remaining conductive portions on the reference plane are annular; the reference plane is a plane where the lower surface of the stack structure is located.

In some examples, the semiconductor structure further comprises a first insulating layer disposed between the conductive structure and the stack structure. And/or, the conductive structure further comprises a second insulating layer disposed between any two adjacent conductive portions.

In some examples, the plurality of conductive portions comprise first conductive portions and second conductive portions, the first conductive sub-portions of the first conductive portions surround the first conductive sub-portions of the second conductive portions.

In some examples, the first conductive sub-portion of the second conductive portion comprises a connecting pillar and a filling pillar. The connecting pillar penetrates through part of the stack structure and is connected with the second conductive sub-portion; the connecting pillar forms a cylindrical structure with a first opening on a single side in a surrounding manner, and the first opening faces a lower side of the stack structure. The filling pillar is located within the cylindrical structure that is formed by the connecting pillar in a surrounding manner; the filling pillar comprises a pillar body and a fixing portion, the pillar body and the connecting pillar are spaced apart from each other; the fixing portion is located at an upper end of the pillar body, and the fixing portion is connected with the pillar body and the connecting pillar.

In some examples, the connecting pillar comprises a first portion, a second portion and a third portion. The first portion penetrates through a film layer between a second dielectric layer that is disposed on the same layer as the gate layer connected with the first conductive portion and a second dielectric layer that is disposed on the same layer as the gate layer connected with the second conductive portion; the first portion forms a cylindrical structure in a surrounding manner, the pillar body is located within the cylindrical structure that is formed by the first portion in a surrounding manner. An orthographic projection of the second portion on a reference plane partially overlaps with an orthographic projection of the first portion on the reference plane; the reference plane is a plane where a lower surface of the stack structure is located; the second portion extends from an upper surface of the stack structure to an upper end of the first portion; the second portion forms a cylindrical structure in a surrounding manner. The third portion blocks the opening on an upper side of the cylindrical structure that is formed by the second portion in a surrounding manner.

In some examples, the second conductive portion further comprises a third insulating layer between the pillar body and the connecting pillar.

In some examples, the second conductive portion further comprises a filling layer between the fixing portion and the connecting pillar.

In some examples, the first conductive sub-portion of the second conductive portion comprises a first sub-pillar and a second sub-pillar. The first sub-pillar penetrates through a film layer between a second dielectric layer that is disposed on the same layer as the gate layer connected with the first conductive portion and a second dielectric layer that is disposed on the same layer as the gate layer connected with the second conductive portion. The second sub-pillar extends from the upper surface of the stack structure to the first sub-pillar.

In another aspect, a fabrication method of a semiconductor structure is provided. The fabrication method of the semiconductor structure comprises: forming a stack structure comprising a plurality of first dielectric layers gate layers which are alternately disposed, the stack structure having a memory region and a connection region, the stack structure in the connection region further comprising a plurality of first dielectric layers and second dielectric layers which are alternately disposed; forming a contact hole located in the connection region; forming a conductive structure within the contact hole, the conductive structure comprising a plurality of conductive portions insulated from each other, each conductive portion penetrating through part of the stack structure and being connected with the gate layers.

In some examples, forming the contact hole comprises: forming a first hole segment of a first sub-hole, the first hole segment of the first sub-hole extending to an upper surface of the first dielectric layer above and adjacent to a corresponding gate layer; etching the bottom of the first hole segment of the first sub-hole to form a first hole segment of a second sub-hole, the first hole segment of the second sub-hole extending to an upper surface of the first dielectric layer above and adjacent to a corresponding gate layer.

In some examples, the stack structure comprises N first dielectric layers, N is an integer greater than 1; the N first dielectric layers are respectively the first to Nth first dielectric layers from the upper surface to the lower surface of the stack structure. Forming the contact hole comprises: forming a first initial sub-hole extending to an upper surface of the second first dielectric layer; etching the bottom of the first initial sub-hole to form a second initial sub-hole extending to an upper surface of the third first dielectric layer; synchronously etching the bottoms of the first initial sub-hole and the second initial sub-hole to form a first hole segment of a first sub-hole and a first hole segment of a second sub-hole, both the first hole segment of the first sub-hole and the first hole segment of the second sub-hole extending to upper surfaces of the first dielectric layers above and adjacent to corresponding gate layers.

In some examples, forming the contact hole further comprises: forming a first insulating layer and removing the first dielectric layers exposed from the bottoms of the first hole segment of the first sub-hole and the first hole segment of the second sub-hole, the first insulating layer covering side walls of the first hole segment of the first sub-hole and the first hole segment of the second sub-hole; etching two second dielectric layers exposed from the bottoms of the two first hole segments to form a second hole segment of the first sub-hole and a second hole segment of the second sub-hole, both the second hole segment of the first sub-hole and the second hole segment of the second sub-hole exposing corresponding gate layers.

In some examples, forming the conductive structure within the contact hole comprises: forming a first conductive film covering the stack structure and side walls and bottom walls of the first hole segment of the first sub-hole and the first hole segment of the second sub-hole and filling the second hole segment of the first sub-hole and the second hole segment of the second sub-hole; removing parts of the first conductive film that cover the stack structure and the bottom walls of the first hole segment of the first sub-hole and the first hole segment of the second sub-hole; forming a second insulating layer and a third insulating layer, the second insulating layer covering the side wall of the first hole segment of the first sub-hole, the third insulating layer covering the side wall of the first hole segment of the second sub-hole; forming a second conductive film covering the stack structure and the side wall and the bottom wall of the first hole segment of the first sub-hole and filling the first hole segment of the second sub-hole; forming a filling layer located within the first hole segment of the first sub-hole; forming a third conductive film covering the stack structure and filling the first hole segment of the first sub-hole; removing parts of the second conductive film and the third conductive film that cover the stack structure.

In some examples, forming the conductive structure within the contact hole comprises: forming a first conductive film covering the stack structure and the side wall and the bottom wall of the first hole segment of the first sub-hole and filling the second hole segment of the first sub-hole and the second sub-hole; removing parts of the first conductive film that cover the stack structure and the bottom wall of the first hole segment of the first sub-hole; forming a second insulating layer covering the side wall of the first hole segment of the first sub-hole; forming a second conductive film covering the stack structure and filling the first sub-hole; removing part of the second conductive film that covers the stack structure.

In yet another aspect, a memory, such as a three-dimensional memory, is provided. The three-dimensional memory comprises the semiconductor structure as described in any one of the examples described herein, and a peripheral device connected with the semiconductor structure.

In yet another aspect, a memory system is provided, which comprises: the three-dimensional memory as described above, and a controller coupled to the three-dimensional memory to control the three-dimensional memory to store data.

It can be understood that, beneficial effects achieved by the fabrication method of the semiconductor structure, the three-dimensional memory and the memory system provided in the above examples of the present disclosure may be referred to the beneficial effects of the semiconductor structure mentioned above, and thus details will not be repeated here.

The foregoing descriptions are merely specific implementations of the present invention, but the protection scope of the present invention is not limited thereto, modifications or substitutions which may be easily conceived by any person skilled in the art within the technical scope disclosed in the present invention should be covered within the protection scope of the present invention. Therefore, the protection scope of the present invention shall be subject to the protection scope of the claims.

What is claimed is:

1. A semiconductor structure comprising:
   a stack structure comprising a memory region and a connection region, wherein:
      the stack structure in the memory region includes a plurality of first dielectric layers and gate layers which are alternately disposed;
      the stack structure in the connection region includes the plurality of first dielectric layers and a plurality of second dielectric layers which are alternately disposed; and
      the plurality of first dielectric layers comprise a first dielectric material, and the plurality of second dielectric layers comprise a second dielectric material different from the first dielectric material; and
   a plurality of conductive structures disposed in the connection region, wherein a conductive structure of the plurality of conductive structures includes a plurality of conductive portions insulated from each other, each conductive portion of the plurality of conductive portions penetrating through part of the stack structure and being connected with the gate layers, and wherein parts of the plurality of conductive portions that penetrate through the stack structure are sequentially disposed in a nested manner.

2. The semiconductor structure of claim 1, wherein a conductive portion of the plurality of conductive portions comprises:
   a first conductive sub-portion penetrating through part of the stack structure, and first conductive sub-portions of the plurality of conductive portions being sequentially disposed in a nested manner; and
   a second conductive sub-portion disposed on the same layer as a gate layer of the gate layers, and the second conductive sub-portion being connected with the gate layer and the first conductive sub-portion.

3. The semiconductor structure of claim 2, wherein the plurality of conductive portions in the conductive structure are located on upper sides of the gate layers connected with conductive portions of the plurality of conductive portions that are farther away from the memory region compared with the gate layers connected with the conductive portions that are closer to the memory region.

4. The semiconductor structure of claim 2, wherein, among the plurality of conductive portions in the conductive structure, the first conductive sub-portion of the conductive portion that is closest to the memory region comprises a first sub-portion and a first lap joint portion, and the first lap joint portion is connected with the first sub-portion.

5. The semiconductor structure of claim 2, wherein among the plurality of conductive portions in the conductive structure, an orthographic projection of the first conductive sub-portion of the conductive portion that is farthest away from the memory region on a reference plane is annular or circular, orthographic projections of the first conductive sub-portions of remaining conductive portions on the reference plane are annular, and the reference plane is a plane where a lower surface of the stack structure is located.

6. The semiconductor structure of claim 1, further comprising a first insulating layer disposed between the conductive structure and the stack structure; and
   the conductive structure further comprises a second insulating layer disposed between any two adjacent conductive portions.

7. The semiconductor structure of claim 2, wherein the plurality of conductive portions comprises first conductive portions and second conductive portions, the first conductive sub-portions of the first conductive portions surround the first conductive sub-portions of the second conductive portions.

8. The semiconductor structure of claim 7, wherein the first conductive sub-portion of a second conductive portion of the second conductive portions comprises:
   a connecting pillar penetrating through part of the stack structure and being connected with the second conductive sub-portion, the connecting pillar forming a cylindrical structure with a first opening on a single side in a surrounding manner, and the first opening facing a lower side of the stack structure; and
   a filling pillar within the cylindrical structure that is formed by the connecting pillar in a surrounding manner, the filling pillar comprising a pillar body and a fixing portion, the pillar body and the connecting pillar being spaced apart from each other, the fixing portion being located at an upper end of the pillar body, and the fixing portion being connected with the pillar body and the connecting pillar.

9. The semiconductor structure of claim 8, wherein the connecting pillar comprises:
   a first portion penetrating through a film layer between a second dielectric layer that is disposed on the same layer as the gate layer connected with a first conductive portion of the first conductive portions and a second dielectric layer that is disposed on the same layer as the gate layer connected with the second conductive portion, the first portion forming a cylindrical structure in a surrounding manner, and the pillar body being located within the cylindrical structure that is formed by the first portion in a surrounding manner;
   a second portion, an orthographic projection of the second portion on a reference plane partially overlapping with an orthographic projection of the first portion on the reference plane, the reference plane being a plane where a lower surface of the stack structure is located, the second portion extending from an upper surface of the stack structure to an upper end of the first portion, and the second portion forming a cylindrical structure in a surrounding manner; and
   a third portion blocking an opening on an upper side of the cylindrical structure that is formed by the second portion in a surrounding manner.

10. The semiconductor structure of claim 8, wherein the second conductive portion further includes a third insulating layer between the pillar body and the connecting pillar.

11. The semiconductor structure of claim 8, wherein the second conductive portion further includes a filling layer between the fixing portion and the connecting pillar.

12. The semiconductor structure of claim 11, wherein the first conductive sub-portion of the second conductive portion comprises:
   a first sub-pillar penetrating through a film layer between a second dielectric layer that is disposed on the same layer as the gate layer connected with a first conductive portion of the first conductive portions and a second dielectric layer that is disposed on the same layer as the gate layer connected with the second conductive portion; and a second sub-pillar extending from an upper surface of the stack structure to the first sub-pillar.

13. A fabrication method of a semiconductor structure, the method comprising:

forming a stack structure comprising a memory region and a connection region, wherein:

the stack structure in the memory region includes a plurality of first dielectric layers and gate layers which are alternately disposed;

the stack structure in the connection region includes the plurality of the first dielectric layers and a plurality of second dielectric layers which are alternately disposed; and the plurality of first dielectric layers comprise a first dielectric material, and the plurality of second dielectric layers comprise a second dielectric material different from the first dielectric material;

forming a contact hole located in the connection region; and forming a conductive structure within the contact hole, the conductive structure comprising a plurality of conductive portions insulated from each other, each conductive portion of the plurality of conductive portions penetrating through part of the stack structure and being connected with the gate layers, wherein parts of the plurality of conductive portions that penetrate through the stack structure are sequentially disposed in a nested manner.

14. The fabrication method of claim 13, wherein forming the contact hole comprises:

forming a first hole segment of a first sub-hole, the first hole segment of the first sub-hole extending to an upper surface of a first dielectric layer of the plurality of first dielectric layers above and adjacent to a corresponding gate layer; and etching a bottom of the first hole segment of the first sub-hole to form a first hole segment of a second sub-hole, the first hole segment of the second sub-hole extending to the upper surface of the first dielectric layer above and adjacent to the corresponding gate layer.

15. The fabrication method of claim 13, wherein the stack structure comprises N first dielectric layers, N is an integer greater than 1, the N first dielectric layers are respectively a first to Nth first dielectric layers from an upper surface to a lower surface of the stack structure; and forming the contact hole includes:

forming a first initial sub-hole extending to an upper surface of a second first dielectric layer;

etching a bottom of the first initial sub-hole to form a second initial sub-hole extending to an upper surface of a third first dielectric layer; and synchronously etching the bottoms of the first initial sub-hole and the second initial sub-hole to form a first hole segment of a first sub-hole and a first hole segment of a second sub-hole, both the first hole segment of the first sub-hole and the first hole segment of the second sub-hole extending to upper surfaces of the first dielectric layers above and adjacent to corresponding gate layers.

16. The fabrication method of claim 14, wherein forming the contact hole further comprises:

forming a first insulating layer and removing the plurality of first dielectric layers exposed from a bottom of the first hole segment of the first sub-hole and the first hole segment of the second sub-hole, the first insulating layer covering side walls of the first hole segment of the first sub-hole and the first hole segment of the second sub-hole; and etching two second dielectric layers exposed from bottoms of two first hole segments to form a second hole segment of the first sub-hole and a second hole segment of the second sub-hole, both the second hole segment of the first sub-hole and the second hole segment of the second sub-hole exposing corresponding gate layers.

17. The fabrication method of claim 16, wherein forming the conductive structure within the contact hole comprises:

forming a first conductive film covering the stack structure and side walls and bottom walls of the first hole segment of the first sub-hole and the first hole segment of the second sub-hole and filling the second hole segment of the first sub-hole and the second hole segment of the second sub-hole;

removing parts of the first conductive film that cover the stack structure and the bottom walls of the first hole segment of the first sub-hole and the first hole segment of the second sub-hole;

forming a second insulating layer and a third insulating layer, the second insulating layer covering the side wall of the first hole segment of the first sub-hole, the third insulating layer covering the side wall of the first hole segment of the second sub-hole;

forming a second conductive film covering the stack structure and the side wall and the bottom wall of the first hole segment of the first sub-hole and filling the first hole segment of the second sub-hole;

forming a filling layer within the first hole segment of the first sub-hole;

forming a third conductive film covering the stack structure and filling the first hole segment of the first sub-hole; and removing parts of the second conductive film and the third conductive film that cover the stack structure.

18. The fabrication method of claim 16, wherein forming the conductive structure within the contact hole comprises:

forming a first conductive film covering the stack structure and side wall and bottom wall of the first hole segment of the first sub-hole and filling the second hole segment of the first sub-hole and the second sub-hole;

removing parts of the first conductive film that cover the stack structure and the bottom wall of the first hole segment of the first sub-hole;

forming a second insulating layer covering the side wall of the first hole segment of the first sub-hole;

forming a second conductive film covering the stack structure and filling the first sub-hole; and removing part of the second conductive film that covers the stack structure.

19. A memory system, comprising:

a three-dimensional memory, including:

a stack structure comprising a memory region and a connection region, wherein:

the stack structure in the memory region includes a plurality of first dielectric layers and gate layers which are alternately disposed;

the stack structure in the connection region further includes the plurality of first dielectric layers and a plurality of second dielectric layers which are alternately disposed; and the plurality of first dielectric layers comprise a first dielectric material, and the plurality of second dielectric layers comprise a second dielectric material different from the first dielectric material; and a plurality of conductive structures disposed in the connection region, wherein a conductive structure of the plurality of conductive structures includes a plurality of conductive portions insulated from each other, each conductive portion of the plurality of conductive portions penetrating through part of the stack structure and being connected with the gate layers, and wherein parts of the plurality of conductive portions that penetrate through the stack structure are sequentially disposed in a nested manner;

a peripheral device connected with the stack structure; and a controller coupled to the three-dimensional memory to control the three-dimensional memory to store data.

20. The memory system of claim 19, wherein a conductive portion of the plurality of conductive portions comprises:

a first conductive sub-portion penetrating through part of the stack structure, and first conductive sub-portions of the plurality of conductive portions being sequentially disposed in a nested manner; and a second conductive sub-portion disposed on the same layer as a gate layer of the gate layers, and the second conductive sub-portion being connected with the gate layer and the first conductive sub-portion.

* * * * *